(12) United States Patent
Lee et al.

(10) Patent No.: US 12,046,617 B2
(45) Date of Patent: Jul. 23, 2024

(54) IMAGE SENSOR AND METHOD OF FABRICATING THE SAME

(71) Applicant: SAMSUNG ELECTRONICS CO., LTD., Suwon-si (KR)

(72) Inventors: Eun-Ji Lee, Suwon-si (KR); Hyunchul Kim, Seoul (KR); Tae-Hun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 441 days.

(21) Appl. No.: 17/387,410

(22) Filed: Jul. 28, 2021

(65) Prior Publication Data

US 2022/0077204 A1 Mar. 10, 2022

(30) Foreign Application Priority Data

Sep. 4, 2020 (KR) .................. 10-2020-0112900

(51) Int. Cl.
*H01L 27/146* (2006.01)

(52) U.S. Cl.
CPC .... *H01L 27/1463* (2013.01); *H01L 27/14621* (2013.01); *H01L 27/14627* (2013.01);
(Continued)

(58) Field of Classification Search
CPC ........... H01L 27/1463; H01L 27/14621; H01L 27/14627; H01L 27/14636;
(Continued)

(56) References Cited

U.S. PATENT DOCUMENTS

| 8,035,142 B2 | 10/2011 | Mouli |
| 9,825,080 B2 | 11/2017 | Ahmed et al. |

(Continued)

FOREIGN PATENT DOCUMENTS

| JP | 2019-176089 | 10/2019 |
| KR | 10-0486757 | 5/2005 |

(Continued)

OTHER PUBLICATIONS

S.V. Hattangady, et al., "Ultrathin nitrogen-profile engineered gate dielectric films", 1996 IEEE.

(Continued)

*Primary Examiner* — Farun Lu
*Assistant Examiner* — Sandra Milena Rodriguez Villan
(74) *Attorney, Agent, or Firm* — F. Chau & Associates, LLC

(57) ABSTRACT

An image sensor includes a substrate including a plurality of pixel regions, and a deep isolation pattern in the substrate between the pixel regions. The deep isolation pattern includes a semiconductor pattern penetrating at least a portion of the substrate, and a dielectric pattern disposed between the substrate and the semiconductor pattern. The dielectric pattern includes a first part disposed adjacent to the semiconductor pattern, and a second part disposed between the substrate and the first part. The semiconductor pattern includes a first semiconductor pattern and a second semiconductor pattern. The first semiconductor pattern is disposed between the dielectric pattern and the second semiconductor pattern. The first part of the dielectric pattern includes a material different from a material of the second part of the dielectric pattern. A thickness of the first part of the dielectric pattern is less than a thickness of the second part of the dielectric pattern.

19 Claims, 17 Drawing Sheets

(52) U.S. Cl.
CPC .. *H01L 27/14636* (2013.01); *H01L 27/14643* (2013.01); *H01L 27/14685* (2013.01); *H01L 27/14689* (2013.01)

(58) Field of Classification Search
CPC ......... H01L 27/14643; H01L 27/14685; H01L 27/14689; H01L 27/14612; H01L 27/1464; H01L 27/14603; H01L 27/14605; H01L 27/14632; H01L 27/146
See application file for complete search history.

(56) References Cited

U.S. PATENT DOCUMENTS

| | | | |
|---|---|---|---|
| 2005/0250293 A1* | 11/2005 | Jung | H01L 21/76232 257/E21.549 |
| 2006/0102938 A1 | 5/2006 | Park et al. | |
| 2014/0374868 A1 | 12/2014 | Lee et al. | |
| 2015/0243694 A1* | 8/2015 | Ihara | H01L 27/14621 257/443 |
| 2020/0066768 A1* | 2/2020 | Cheng | H01L 27/1464 |
| 2020/0144316 A1 | 5/2020 | Kim et al. | |
| 2020/0350199 A1* | 11/2020 | Chang | H01L 21/0217 |

FOREIGN PATENT DOCUMENTS

| | | |
|---|---|---|
| KR | 10-0614653 | 8/2006 |
| KR | 10-0670606 | 1/2007 |
| KR | 10-0776162 | 11/2007 |
| KR | 1020090079105 | 7/2009 |

OTHER PUBLICATIONS

Nak-Jin Son, et al., "A Unique Dual-Poly Gate Technology for 1.2-V Mobile DRAM with Simple In situ n+-Doped Polysilicon", IEEE Transactions on Electron Devices, vol. 51, No. 10, Oct. 2004.

* cited by examiner

IMAGE SENSOR AND METHOD OF FABRICATING THE SAME

CROSS-REFERENCE TO RELATED APPLICATIONS

This U.S. nonprovisional application claims priority under 35 U.S.C. § 119 to Korean Patent Application No. 10-2020-0112900, filed on Sep. 4, 2020 in the Korean Intellectual Property Office, the disclosure of which is hereby incorporated by reference in its entirety.

TECHNICAL FIELD

Embodiments of the present inventive concept relate to an image sensor and a method of fabricating the same, and more particularly, to a complementary metal oxide semiconductor (CMOS) image sensor and a method of fabricating the same.

DISCUSSION OF RELATED ART

An image sensor is a semiconductor device that transforms optical images into electrical signals. Recent advances in computer and communication industries have led to strong demands in high performances image sensors in various consumer electronic devices such as, for example, digital cameras, camcorders, personal communication systems (PCSs), game devices, security cameras, medical micro cameras, etc. An image sensor may be classified as a charge coupled device (CCD) type or a complementary metal oxide semiconductor (CMOS) type. A CMOS type image sensor may be referred to as a CMOS image sensor (CIS). A CIS has a plurality of two-dimensionally arranged pixels, each of which includes a photodiode. The photodiode serves to transform an incident light into an electrical signal. The pixels may be defined by a deep isolation pattern disposed therebetween.

SUMMARY

Embodiments of the present inventive concept provide an image sensor having a reduced number of defects, and a method of fabricating the same.

Embodiments of the present inventive concept provide a highly-integrated image sensor, and a method of fabricating the same.

According to embodiments of the present inventive concept, an image sensor includes a substrate including a plurality of pixel regions, and a deep isolation pattern in the substrate between the pixel regions. The deep isolation pattern includes a semiconductor pattern penetrating at least a portion of the substrate, and a dielectric pattern disposed between the substrate and the semiconductor pattern. The dielectric pattern includes a first part disposed adjacent to the semiconductor pattern, and a second part disposed between the substrate and the first part. The semiconductor pattern includes a first semiconductor pattern and a second semiconductor pattern. The first semiconductor pattern is disposed between the dielectric pattern and the second semiconductor pattern. The first part of the dielectric pattern includes a material different from a material of the second part of the dielectric pattern. A thickness of the first part of the dielectric pattern is less than a thickness of the second part of the dielectric pattern.

According to embodiments of the present inventive concept, an image sensor includes a substrate that includes a plurality of pixel regions, and a deep isolation pattern disposed in the substrate between the plurality of pixel regions. The deep isolation pattern includes a semiconductor pattern disposed between the plurality of pixel regions, a buried dielectric pattern disposed on the semiconductor pattern, and a dielectric pattern disposed between the semiconductor pattern and each of the plurality of pixel regions, the dielectric pattern extending onto a lateral surface of the buried dielectric pattern. The dielectric pattern includes a first part disposed adjacent to a lateral surface of the semiconductor pattern and the lateral surface of the buried dielectric pattern, and a second part disposed between the first part of the dielectric pattern and each of the plurality of pixel regions. The first part of the dielectric pattern includes a material different from a material of the second part of the dielectric pattern, and a thickness of the first part of the dielectric pattern is less than a thickness of the second part of the dielectric pattern.

According to embodiments of the present inventive concept, a method of fabricating an image sensor includes forming, in a substrate, a trench that defines a plurality of pixel regions, forming, on the substrate, a dielectric layer that fills a portion of the trench, nitriding a surface of the dielectric layer by performing a nitridation process, and forming a semiconductor pattern that fills the trench. The nitridation process causes the dielectric layer to separate into a first part and a second part that include different materials from each other. The first part of the dielectric layer includes one or more of a nitride and an oxynitride.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
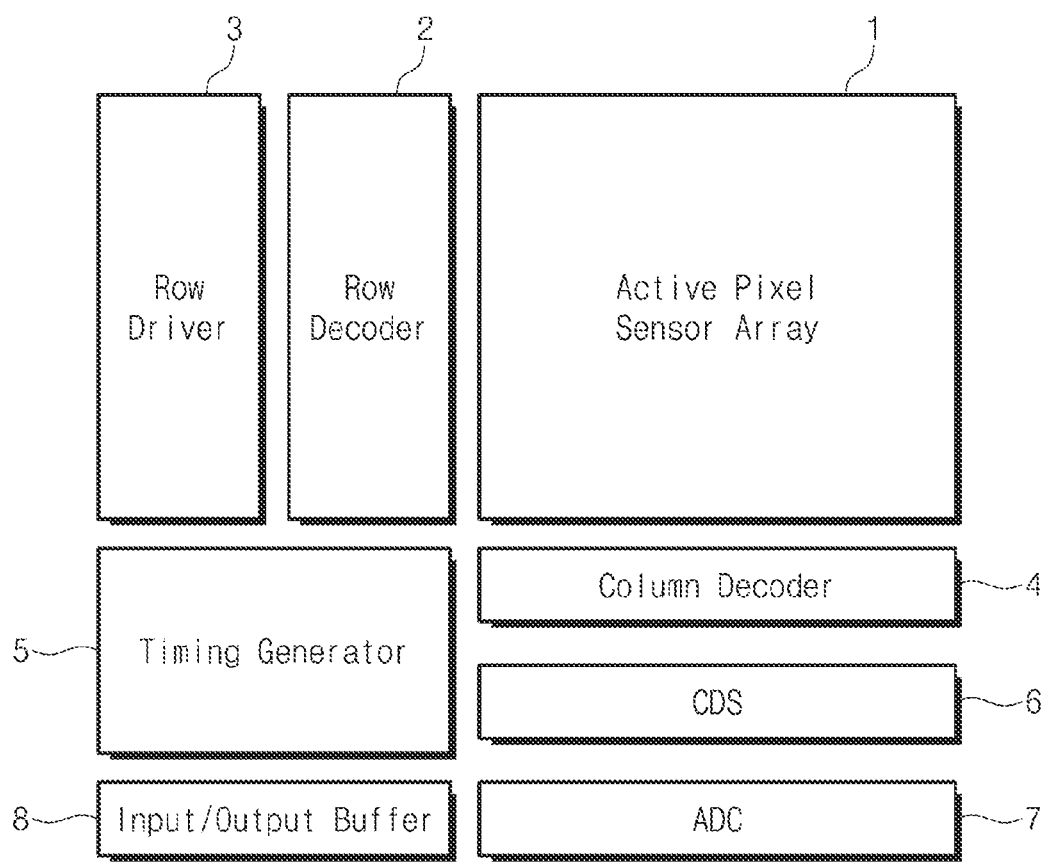
FIG. 1 illustrates a block diagram showing an image sensor according to embodiments of the present inventive concept.

Embodiments of the present inventive concept will be described more fully hereinafter with reference to the accompanying drawings. Like reference numerals may refer to like elements throughout the accompanying drawings.

The terms "first," "second," "third," etc. are used herein to distinguish one element from another, and the elements are not limited by these terms. Thus, a "first" element in an embodiment may be described as a "second" element in another embodiment.

As used herein, the singular forms "a", "an" and "the" are intended to include the plural forms as well, unless the context clearly indicates otherwise.

Herein, when elements are described as being substantially coplanar with one another, it is to be understood that elements are exactly coplanar with one another, or almost coplanar with one another (e.g., within a measurement error), as would be understood by a person having ordinary skill in the art. Further, when one value is described as being about the same as or about equal to another value, it is to be understood that the values are equal to each other to within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

FIG. 1 illustrates a block diagram showing an image sensor according to embodiments of the present inventive concept.

Referring to FIG. 1, an image sensor may include an active pixel sensor array 1, a row decoder 2 (also referred to as a row decoder circuit), a row driver 3 (also referred to as a row driver circuit), a column decoder 4 (also referred to as a column decoder circuit), a timing generator 5 (also referred to as a timing generator circuit), a correlated double sampler (CDS) 6 (also referred to as a CDS circuit), an analog-to-digital converter (ADC) 7 (also referred to as an ADC circuit), and an input/output (I/O) buffer 8 (also referred to as an I/O buffer circuit).

The active pixel sensor array 1 may include a plurality of two-dimensionally arranged pixels, each of which is configured to convert optical signals into electrical signals. The active pixel sensor array 1 may be driven by a plurality of driving signals such as, for example, a pixel select signal, a reset signal, and a charge transfer signal received from the row driver 3. In addition, the correlated double sampler 6 may be provided with the electrical signals that are converted by the active pixel sensor array 1.

The row driver 3 may provide the active pixel sensor array 1 with several driving signals for driving the plurality of pixels in accordance with a decoded result obtained from the row decoder 2. In a case in which the plurality of pixels is arranged in a matrix shape, the driving signals may be provided for respective rows.

The timing generator 5 may provide timing and control signals to the row decoder 2 and the column decoder 4.

The correlated double sampler 6 may receive the electrical signals generated from the active pixel sensor array 1, and may hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter 7 may convert analog signals, which correspond to the difference level received from the correlated double sampler 6, into digital signals, and then output the converted digital signals.

The input/output buffer 8 may latch the digital signals and then sequentially output the latched digital signals to an image signal processing unit in response to the decoded result obtained from the column decoder 4.

Figure 2:
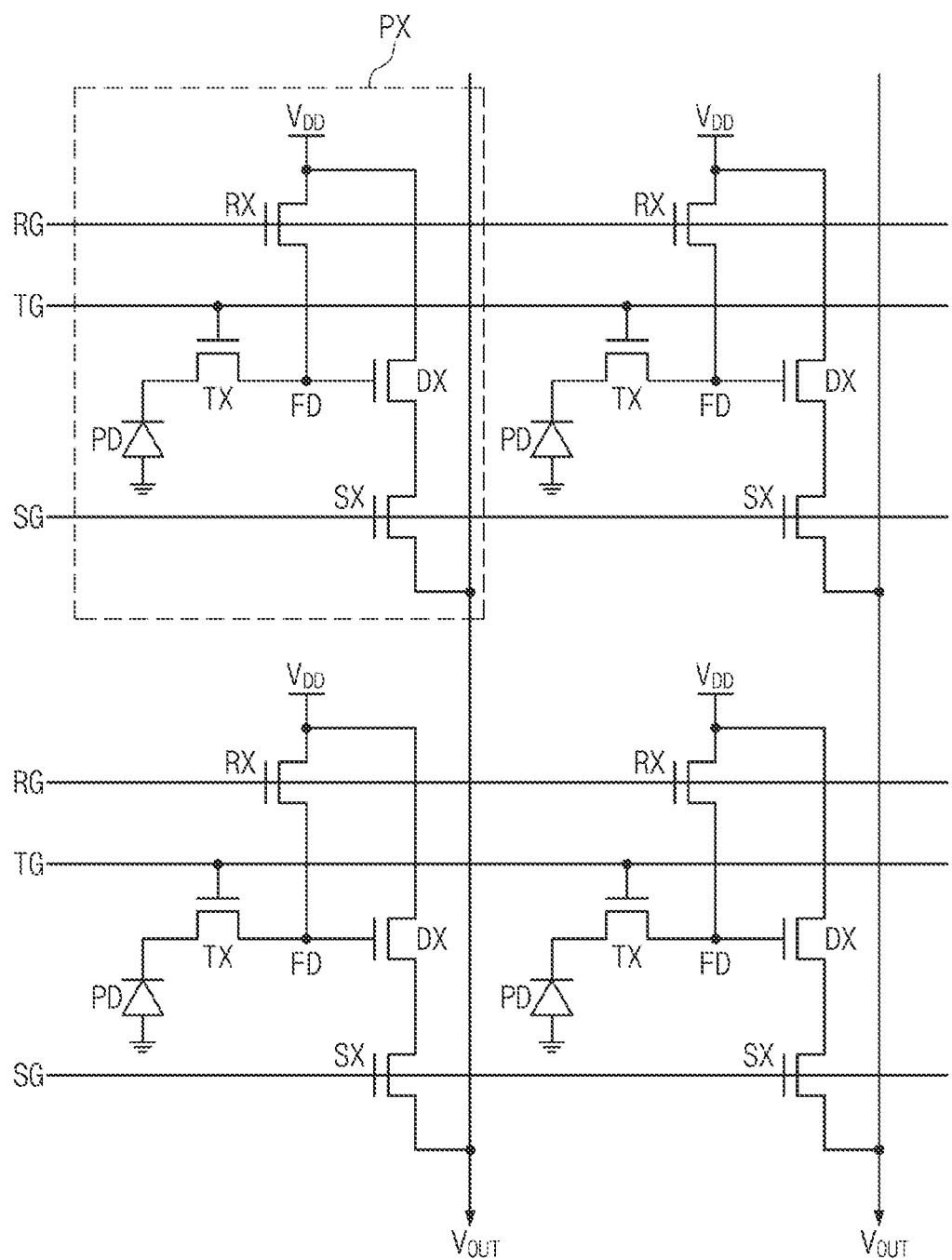
FIG. 2 illustrates a circuit diagram showing an active pixel sensor array of an image sensor according to embodiments of the present inventive concept.

FIG. 2 illustrates a circuit diagram showing an active pixel sensor array of an image sensor according to embodiments of the present inventive concept.

Referring to FIGS. 1 and 2, the active pixel sensor array 1 may include a plurality of pixels PX, which may be arranged in a matrix shape. Each of the pixels PX may include a transfer transistor TX and logic transistors RX, SX, and DX. The logic transistors RX, SX, and DX may include a reset transistor RX, a select transistor SX, and a drive transistor DX. The transfer transistor TX, the reset transistor RX, and the select transistor SX may respectively include a transfer gate TG, a reset gate RG, and a select gate SG. Each of the pixels PX may further include a photoelectric conversion element PD and a floating diffusion region FD.

The photoelectric conversion element PD may create and accumulate photo-charges in proportion to an amount of externally incident light. The photoelectric conversion element PD may be, for example, a photodiode including a P-type impurity region and an N-type impurity region. The transfer transistor TX may transfer charges generated in the photoelectric conversion element PD into the floating diffusion region FD. The floating diffusion region FD may accumulatively store the charges generated and transferred from the photoelectric conversion element PD. The drive transistor DX may be controlled by an amount of photocharges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ connected to the source electrode of the reset transistor RX. Accordingly, when the reset transistor RX is turned on, the charges accumulated in the floating diffusion region FD may be exhausted, and thus, the floating diffusion region FD may be reset.

The drive transistor DX may serve as a source follower buffer amplifier. The drive transistor DX may amplify a variation in electrical potential of the floating diffusion region HD and may output the amplified electrical potential to an output line $V_{OUT}$.

The select transistor SX may select each row of the pixels P to be read out. When the select transistor SX is turned on, the power voltage $V_{DD}$ may be applied to a drain electrode of the drive transistor DX.

FIG. 2 depicts, by way of example, a unit pixel PX that includes one photoelectric conversion element PD and four transistors TX, RX, DX, and SX. However, the image sensor according to embodiments of the present inventive concept is not limited thereto. For example, according to embodiments of the inventive concept, neighboring pixels PX may share the reset transistor RX, the drive transistor DX, or the select transistor SX. Thus, according to embodiments, integration of the image sensor may be increased.

Figure 3:
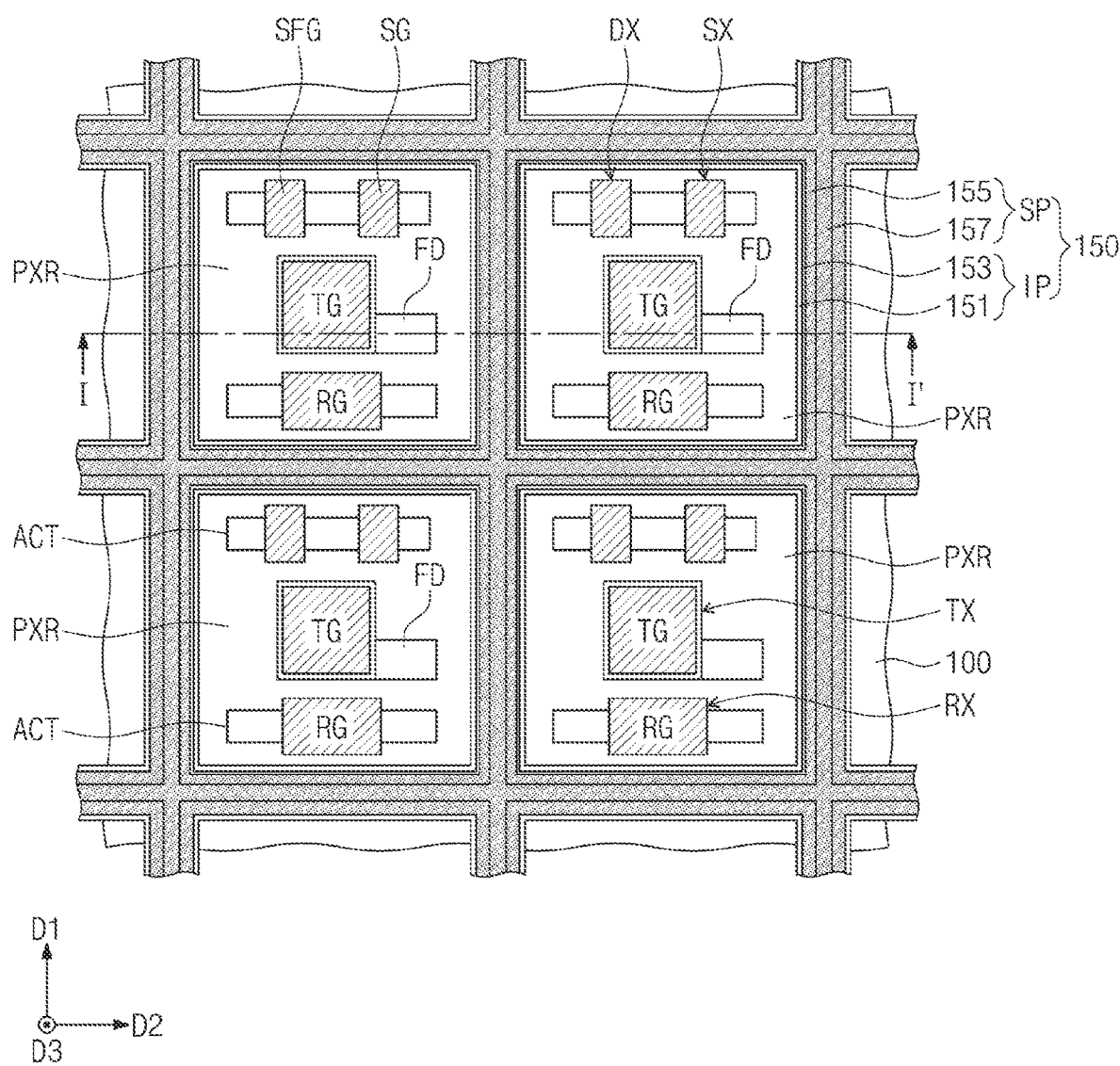
FIG. 3 illustrates a plan view showing an image sensor according to embodiments of the present inventive concept.
Figure 4:
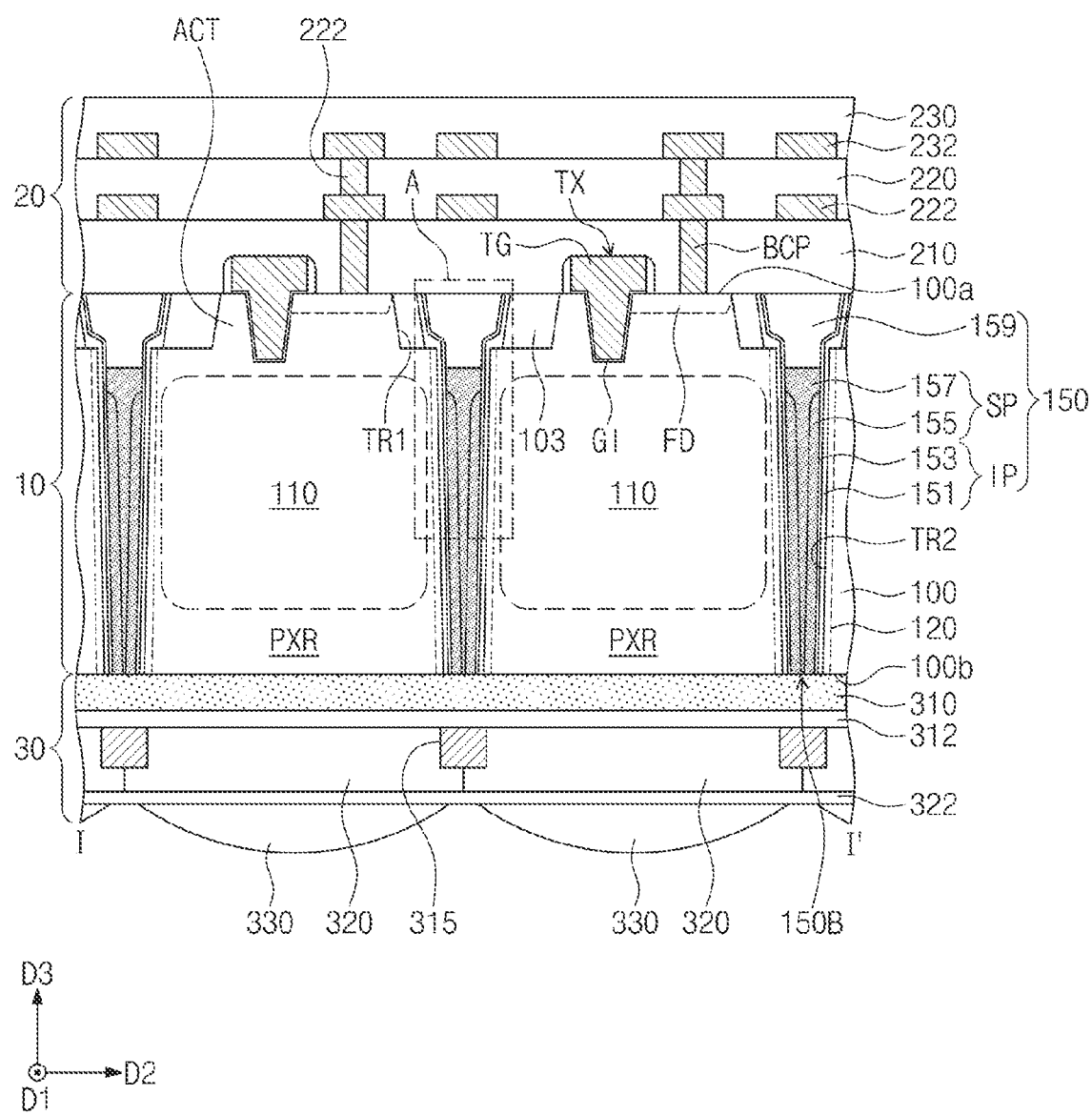
FIG. 4 illustrates a cross-sectional view taken along line I-I' of FIG. 3 according to embodiments of the present inventive concept.
Figure 5A:
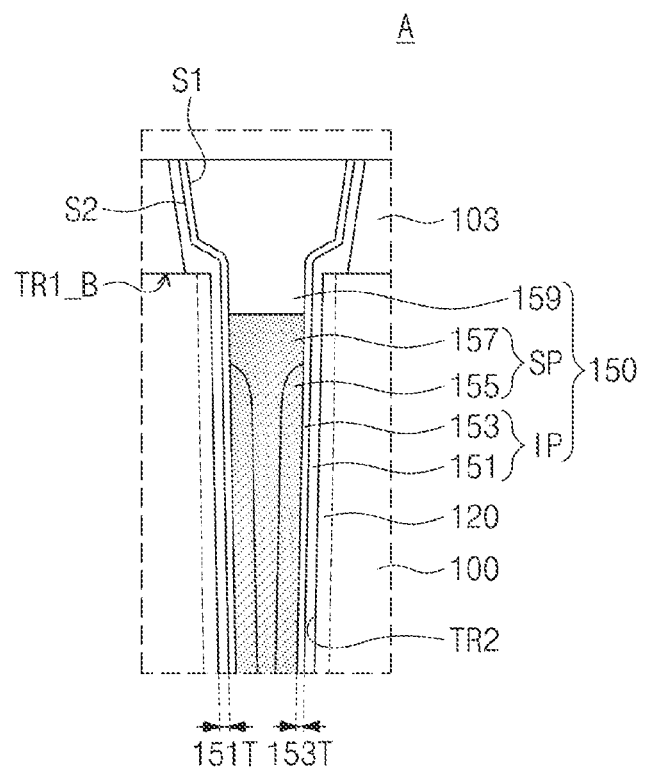
FIG. 5A illustrates an enlarged view showing section A of FIG. 4 according to embodiments of the present inventive concept.
Figure 5B:
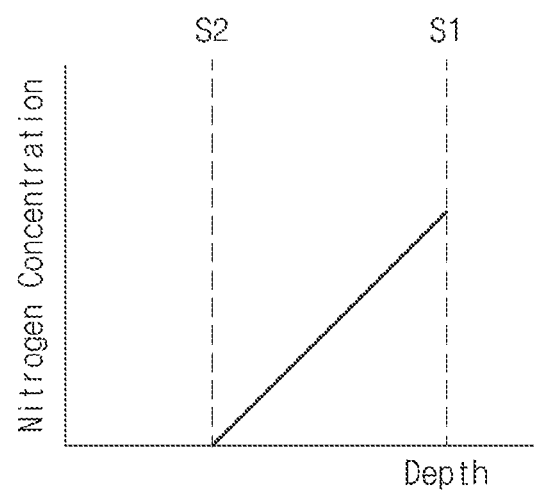
FIG. 5B illustrates a graph showing how nitrogen concentration changes in a dielectric pattern of FIG. 5A according to embodiments of the present inventive concept.

FIG. 3 illustrates a plan view showing an image sensor according to embodiments of the present inventive concept. FIG. 4 illustrates a cross-sectional view taken along line I-I' of FIG. 3 according to embodiments of the present inventive concept. FIG. 5A illustrates an enlarged view showing section A of FIG. 4 according to embodiments of the present inventive concept. FIG. 5B illustrates a graph showing how nitrogen concentration changes in a dielectric pattern of FIG. 5A according to embodiments of the present inventive concept.

Referring to FIGS. 3 and 4, an image sensor may include a photoelectric conversion layer 10, a wiring layer 20, and an optical transmittance layer 30. The photoelectric conversion layer 10 may be disposed between the wiring layer 20 and the optical transmittance layer 30.

The photoelectric conversion layer 10 may include, for example, a substrate 100, which may include a plurality of pixel regions PXR. The substrate 100 may be a semiconductor substrate such as, for example, a silicon substrate, a germanium substrate, a silicon-germanium substrate, a II-VI group compound semiconductor substrate, or a III-V group compound semiconductor substrate, or a silicon-on-insulator (SOI) substrate. The substrate 100 may have a first surface 100a and a second surface 100b that are opposite to each other. The plurality of pixel regions PXR may be two-dimensionally arranged along a first direction D1 and a second direction D2 that are substantially parallel to the second surface 100b of the substrate 100. The first direction D1 and the second direction D2 may intersect each other.

The photoelectric conversion layer 10 may further include a deep isolation pattern 150 disposed in the substrate 100 between the plurality of pixel regions PXR. When viewed in a plan view, the deep isolation pattern 150 may have a grid structure that surrounds each of the plurality of pixel regions PXR. The deep isolation pattern 150 may penetrate at least a portion of the substrate 100 along a third direction D3 substantially perpendicular to the second surface 100b of the substrate 100. According to embodiments, the deep isolation pattern 150 may extend from the first surface 100a toward the second surface 100b of the substrate 100, and may have a bottom surface 150B substantially coplanar with the second surface 100b of the substrate 100. For example, the bottom surface 150B of the deep isolation pattern 150 and the second surface 100b of the substrate 100 may be located at substantially the same level. For example, according to embodiments, the deep isolation pattern 150 may fully extend through the substrate 100 from the first surface 100a of the substrate 100 to the second surface 100b of the substrate 100. The deep isolation pattern 150 may prevent or reduce cross-talk between neighboring pixel regions PXR.

Referring to FIGS. 4 and 5A, the deep isolation pattern 150 may include a semiconductor pattern SP that penetrates at least a portion of the substrate 100, and a dielectric pattern IP disposed between the semiconductor pattern SP and the substrate 100. The semiconductor pattern SP may be disposed between the plurality of pixel regions PXR, and the dielectric pattern IP may be interposed between the semiconductor pattern SP and each of the plurality of pixel regions PXR. According to embodiments, the semiconductor pattern SP and the dielectric pattern IP may have bottom surfaces, each of which may correspond to the bottom surface 150B of the deep isolation pattern 150, and each of which may be substantially coplanar with the second surface 100b of the substrate 100. According to embodiments, the deep isolation pattern 150 may further include a buried dielectric pattern 159 on the semiconductor pattern SP. The dielectric pattern IP may extend from a lateral surface of the semiconductor pattern SP toward a lateral surface of the buried dielectric pattern 159.

The semiconductor pattern SP may include a first semiconductor pattern 155 adjacent to the dielectric pattern IP and a second semiconductor pattern 157 disposed on the dielectric pattern IP across the first semiconductor pattern 155. The second semiconductor pattern 157 may cover an uppermost surface of the first semiconductor pattern 155 and may contact the dielectric pattern IP. The buried dielectric pattern 159 may be disposed on the second semiconductor pattern 157. The second semiconductor pattern 157 may extend between the first semiconductor pattern 155 and the buried dielectric pattern 159, thereby contacting the dielectric pattern IP. Each of the first and second semiconductor patterns 155 and 157 may include a semiconductor material doped with impurities. The impurities may have, for example, P-type or N-type conductivity. For example, each of the first and second semiconductor patterns 155 and 157 may include polycrystalline silicon doped with boron.

The dielectric pattern IP may include a first part 153 adjacent (e.g., directly adjacent) to the semiconductor pattern SP and a second part 151 adjacent (e.g., directly adjacent) to the substrate 100. The first part 153 of the dielectric pattern IP may be adjacent (e.g., directly adjacent) to the lateral surface of the semiconductor pattern SP and the lateral surface of the buried dielectric pattern 159. The second part 151 of the dielectric pattern IP may be separated across the first part 153 from the lateral surface of the semiconductor pattern SP and the lateral surface of the buried dielectric pattern 159, and may be adjacent (e.g., directly adjacent) to each of the plurality of pixel regions PXR. The first semiconductor pattern 155 may be adjacent (e.g., directly adjacent) to the first part 153 of the dielectric pattern IP. The second semiconductor pattern 157 may cover the uppermost surface of the first semiconductor pattern 155 and may contact the first part 153 of the dielectric pattern IP. The buried dielectric pattern 159 may contact the first part 153 of the dielectric pattern IP. For example, according to embodiments, the first part 153 of the dielectric pattern IP may be disposed adjacent to the semiconductor pattern SP, and the second part 151 of the dielectric pattern IP may be disposed between the substrate 100 and the first part 153 of the dielectric pattern IP. Further, the first semiconductor pattern 155 may be disposed between the dielectric pattern IP and the second semiconductor pattern 157.

The first part 153 of the dielectric pattern IP may include a different material from that of the second part 151 of the dielectric pattern IP. For example, according to embodiments, the first part 153 of the dielectric pattern IP may include one or more of a nitride and an oxynitride, and the second part 151 of the dielectric pattern IP may include an oxide. For example, according to embodiments, the first part 153 of the dielectric pattern IP may include one or more of silicon nitride and silicon oxynitride, and the second part 151 of the dielectric pattern IP may include silicon oxide. According to embodiments, the first part 153 and the second part 151 do not include a same material. According to embodiments, the first part 153 of the dielectric pattern IP may include a nitrogen element, and the second part 151 of the dielectric pattern IP does not include a nitrogen element (e.g., the second part 151 of the dielectric pattern IP is free of a nitrogen element).

The dielectric pattern IP may have a thickness in a direction (e.g., the second direction D2) substantially parallel to the second surface 100b of the substrate 100. The second part 151 of the dielectric pattern IP may have a thickness 151T that is measured in the second direction D2 from an inner lateral surface of the substrate 100, and the first part 153 of the dielectric pattern IP may have a thickness 153T that is measured in the second direction D2 from a boundary between the first part 153 and the second part 151. The thickness 153T of the first part 153 of the dielectric pattern IP may be less than the thickness 151T of the second part 151 of the dielectric pattern IP. A total thickness 151T and 153T of the dielectric pattern IP may range from about 30 Å to about 350 Å. The thickness 153T of the first part 153 of the dielectric pattern IP may be, for example, about 2% to about 10% of the total thickness 151T and 153T of the dielectric pattern IP. For example, the total thickness 151T and 153T of the dielectric pattern IP may be about 180 Å, and the thickness 153T of the first part 153 of the dielectric pattern IP may be about 10 Å.

Referring to FIGS. 5A and 5B, the first part 153 of the dielectric pattern IP may have a first lateral surface S1 adjacent to the semiconductor pattern SP and a second lateral surface S2 adjacent to the second part 151 of the dielectric pattern IP. The semiconductor pattern SP and the buried dielectric pattern 159 may contact the first lateral surface S1 of the first part 153 of the dielectric pattern IP. The first part 153 of the dielectric pattern IP may have a nitrogen concentration that decreases in a direction from the first lateral surface S1 toward the second lateral surface S2. The nitrogen concentration in the first part 153 of the dielectric pattern IP may be at its highest value at a region adjacent to (or in contact with) the first lateral surface S1.

Referring back to FIGS. 3 and 4, each of the plurality of pixel regions PXR may include a photoelectric conversion region 110 and a doped region 120 that extends along a lateral surface of the deep isolation pattern 150. The doped region 120 may be disposed between the photoelectric conversion region 110 and the deep isolation pattern 150.

The substrate 100 may have a first conductivity type, and the photoelectric conversion region 110 may be an area doped with impurities having a second conductivity type different from the first conductivity type. For example, the first conductivity type and the second conductivity type may be a P-type and an N-type conductivity type, respectively. In this case, the impurities having the second conductivity type may include N-type impurities, such as one or more of, for example, phosphorus, arsenic, bismuth, and antimony. The photoelectric conversion region 110 and the substrate 100 may form a PN junction to constitute a photodiode. The doped region 120 may be an area doped with impurities having the first conductivity type. The doped region 120 may prevent the photoelectric conversion region 110 from receiving electrons that have been trapped in dangling bonds that may be present on a lateral surface of each of the plurality of pixel regions PXR, or may reduce the receiving of such electrons, and thus, the dark current of the image sensor may be improved, and the formation of a white spot(s) may be prevented or reduced. The impurities having the first conductivity type may include P-type impurities, such as, for example, boron. According to embodiments, the semiconductor pattern SP of the deep isolation pattern 150 may include a semiconductor material doped with impurities having the first conductivity type (e.g., P-type).

A shallow isolation pattern 103 may be disposed adjacent to the first surface 100a of the substrate 100. Each of the plurality of pixel regions PXR may include active regions ACT defined by the shallow isolation pattern 103. The shallow isolation pattern 103 may include one or more of, for example, a silicon oxide layer, a silicon nitride layer, and a silicon oxynitride layer.

Referring back to FIGS. 4 and 5A, the deep isolation pattern 150 may penetrate the shallow isolation pattern 103 and may penetrate and extend into the substrate 100. The buried dielectric pattern 159 of the deep isolation pattern 150 may be disposed in the shallow isolation pattern 103. The buried dielectric pattern 159 may penetrate the shallow isolation pattern 103 and may contact the semiconductor pattern SP. The dielectric pattern IP of the deep isolation pattern 150 may extend between the shallow isolation pattern 103 and the buried dielectric pattern 159. The first part 153 of the dielectric pattern IP may be adjacent to (or in contact with) the buried dielectric pattern 159, and the second part 151 of the dielectric pattern IP may be adjacent to (or in contact with) the shallow isolation pattern 103.

The shallow isolation pattern 103 may be disposed in a first trench TR1 that extends into the substrate 100 from the first surface 100a of the substrate 100. The deep isolation pattern 150 may be disposed in a second trench TR2 that penetrates the shallow isolation pattern 103 and extends toward the second surface 100b of the substrate 100. Each of the first and second trenches TR1 and TR2 may have a width in a direction (e.g., the second direction D2) substantially parallel to the second surface 100b of the substrate 100. A width of a bottom surface TR1_B of the first trench TR1 may be greater than a width of an upper portion of the second trench TR2. The dielectric pattern IP of the deep isolation pattern 150 may partially cover the bottom surface TR1_B of the first trench TR1.

Referring back to FIGS. 3 and 4, the transfer transistors TX and the logic transistors RX, SX, and DX of FIG. 2 may be disposed on the first surface 100a of the substrate 100.

Each of the transistors TX, RX, SX, and DX may be disposed on the active region ACT that corresponds to the pixel region PXR.

The transfer transistor TX may include a transfer gate TG and a floating diffusion region FD on a corresponding active region ACT. A lower portion of the transfer gate TG may be inserted into the substrate 100, and an upper portion of the transfer gate TG may protrude upwardly from the first surface 100a of the substrate 100. A gate dielectric layer GI may be interposed between the transfer gate TG and the substrate 100. The floating diffusion region FD may be disposed on a corresponding active region ACT on one side of the transfer gate TG. The floating diffusion region FD may be an area doped with impurities having the second conductivity type (e.g., N-type).

The drive transistor DX may include a drive gate SFG on a corresponding active region ACT, and the select transistor SX may include a select gate SG on a corresponding active region ACT. The reset transistor RX may include a reset gate RG on a corresponding active region ACT. An additional gate dielectric layer GI may be interposed between the substrate 100 and each of the drive, select, and reset gates SFG, SG, and RG.

The wiring layer 20 may be disposed on the first surface 100a of the substrate 100. The wiring layer 20 may include a first interlayer dielectric layer 210, a second interlayer dielectric layer 220, and a third interlayer dielectric layer 230 that are sequentially stacked on the first surface 100a of the substrate 100. The wiring layer 20 may further include contact plugs BCP in the first interlayer dielectric layer 210, first wiring patterns 222 in the second interlayer dielectric layer 220, and second wiring patterns 232 in the third interlayer dielectric layer 230. The first interlayer dielectric layer 210 may be disposed on the first surface 100a of the substrate 100 and may cover the transistors TX, RX, SX, and DX, and the contact plugs BCP may be connected to terminals of the transistors TX, RX, SX, and DX. The contact plugs BCP may be connected to corresponding ones of the first wiring patterns 222, and the first wiring patterns 222 may be connected to corresponding ones of the second wiring patterns 232. The first and second wiring patterns 222 and 232 may be electrically connected through the contact plugs BCP to the transistors TX, RX, SX, and DX. Each of the first, second, and third interlayer dielectric layers 210, 220, and 230 may include a dielectric material, and the contact plugs BCP, the first wiring patterns 222, and the second wiring patterns 232 may include a conductive material.

The optical transmittance layer 30 may be disposed on the second surface 100b of the substrate 100. The optical transmittance layer 30 may include a color filter array 320 and a micro-lens array 330 on the second surface 100b of the substrate 100. The color filter array 320 may be disposed between the micro-lens array 330 and the second surface 100b of the substrate 100. The optical transmittance layer 30 may focus and filter externally incident light, and the photoelectric conversion layer 10 may be provided with the focused and filtered light.

The color filter array 320 may include a plurality of color filters that is correspondingly disposed on the plurality of pixel regions PXR. The micro-lens array 330 may include a plurality of micro-lenses that is correspondingly disposed on the plurality of color filters of the color filter array 320. Each of the plurality of micro-lenses of the micro-lens array 330 may vertically overlap (e.g., in the third direction D3) the photoelectric conversion region 110 of a corresponding pixel region PXR.

An antireflection layer 310 may be interposed between the color filter array 320 and the second surface 100b of the substrate 100. The antireflection layer 310 may prevent or reduce light reflection such that the photoelectric conversion region 110 may readily receive light incident onto the second surface 100b of the substrate 100. A first dielectric layer 312 may be interposed between the antireflection layer 310 and the color filter array 320, and a second dielectric layer 322 may be interposed between the color filter array 320 and the micro-lens array 330. A grid 315 may be interposed between the first dielectric layer 312 and the color filter array 320. The grid 315 may vertically overlap the deep isolation pattern 150. The grid 315 may allow the photoelectric conversion region 110 to receive light incident onto the second surface 100b of the substrate 100. The grid 315 may include, for example, metal. The color filter array 320 may extend between neighboring grids 315 and may contact the first dielectric layer 312.

FIGS. 6 to 13 illustrate cross-sectional views taken along line I-I' of FIG. 3, showing a method of fabricating an image sensor according to embodiments of the present inventive concept. For brevity of description, a repetitive explanation of technical aspects and elements of the image sensor described with reference to FIGS. 1 to 5B may be omitted.

Figure 6:
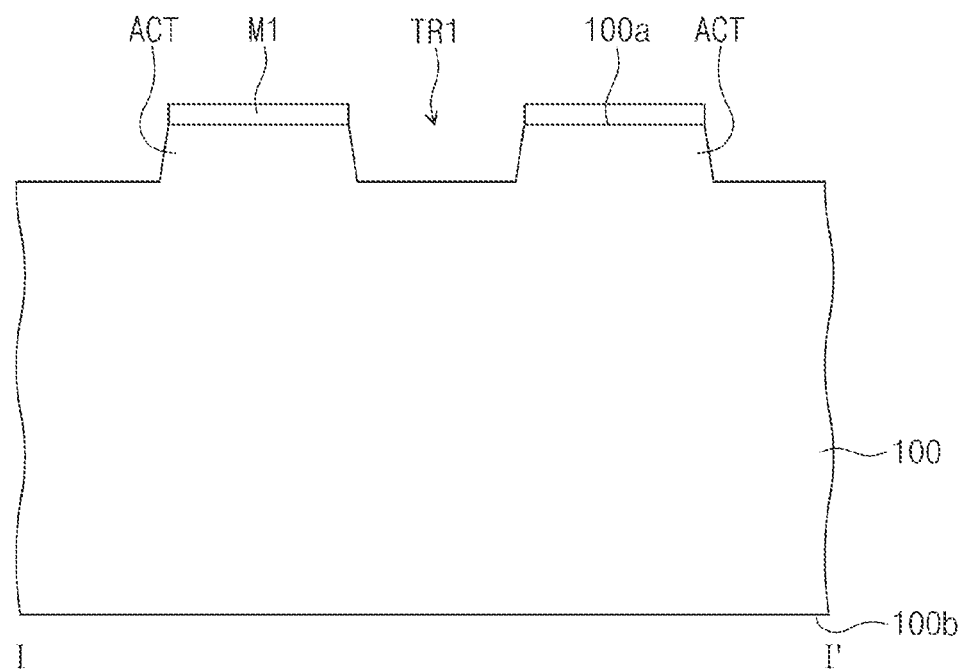
FIGS. 6 to 13 illustrate cross-sectional views taken along line I-I' of FIG. 3, showing a method of fabricating an image sensor according to embodiments of the present inventive concept.

Referring to FIGS. 3 and 6, the substrate 100 may be provided which has the first surface 100a and the second surface 100b that are opposite to each other. The substrate 100 may have a first conductivity type (e.g., P-type). The first trench TR1 may be formed adjacent to the first surface 100a of the substrate 100. The formation of the first trench TR1 may include forming a first mask pattern M1 on the first surface 100a of the substrate 100, and etching the substrate 100 by using the first mask pattern M1 as an etching mask. The first trench TR1 may define the active regions ACT in the substrate 100.

Figure 7:
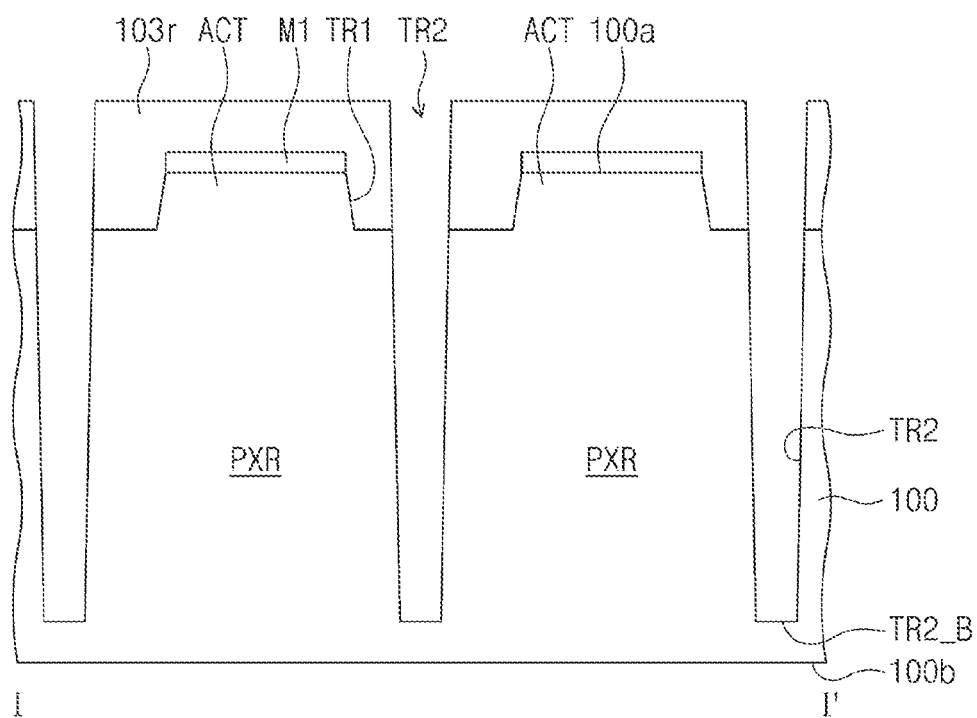

Referring to FIGS. 3 and 7, an isolation layer 103r may be formed on the first surface 100a of the substrate 100. The isolation layer 103r may cover the first mask pattern M1 and may fill the first trench TR1. The isolation layer 103r may include, for example, one or more of a silicon oxide layer, a silicon nitride layer, and a silicon oxynitride layer.

The second trench TR2 may be formed in the substrate 100. The formation of the second trench TR2 may include forming, on the isolation layer 103r, a second mask pattern that defines a region where the second trench TR2 will be formed, and etching the isolation layer 103r and the substrate 100 by using the second mask pattern as an etching mask. The second trench TR2 may have a bottom surface TR2_B at a level higher than that of the second surface 100b of the substrate 100. In this description, the level of the bottom surface TR2_B of the second trench TR2 may be a distance measured in the third direction D3 from the second surface 100b of the substrate 100. The second trench TR2 may define the plurality of pixel regions PXR in the substrate 100. Each of the plurality of pixel regions PXR may include the active regions ACT defined by the first trench TR1.

Figure 8:
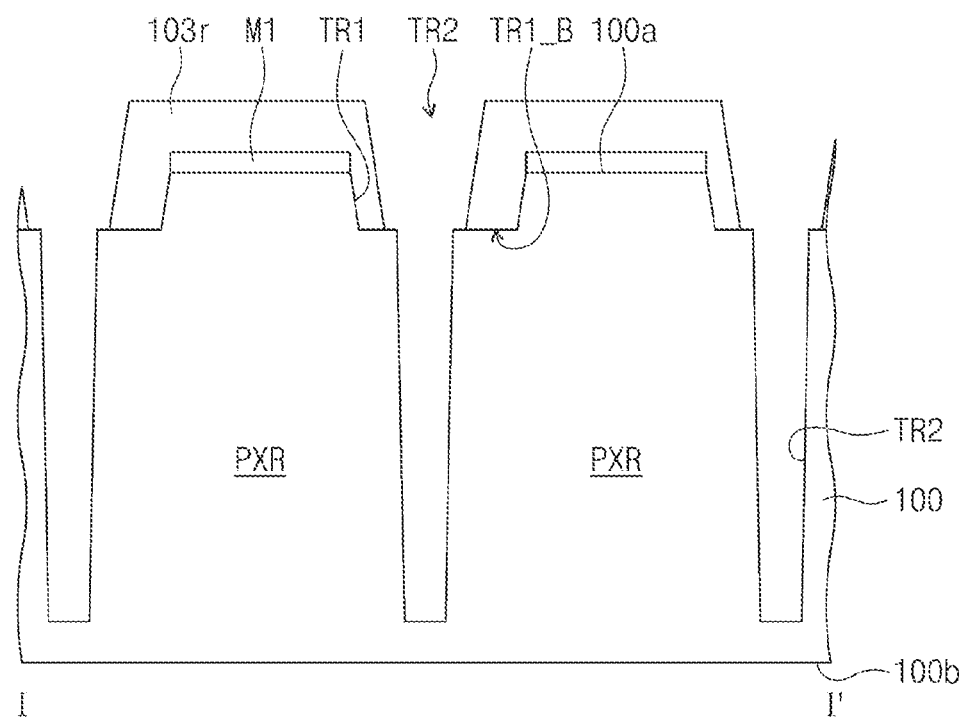

Referring to FIGS. 3 and 8, a portion of the isolation layer 103r, which is exposed to the second trench TR2, may be recessed. Therefore, an upper portion of the second trench TR2 may be expanded, and a portion of the bottom surface TR1_B of the first trench TR1 may be exposed by the second trench TR2. For example, a wet etching process may be performed to partially recess the isolation layer 103r.

Figure 9:
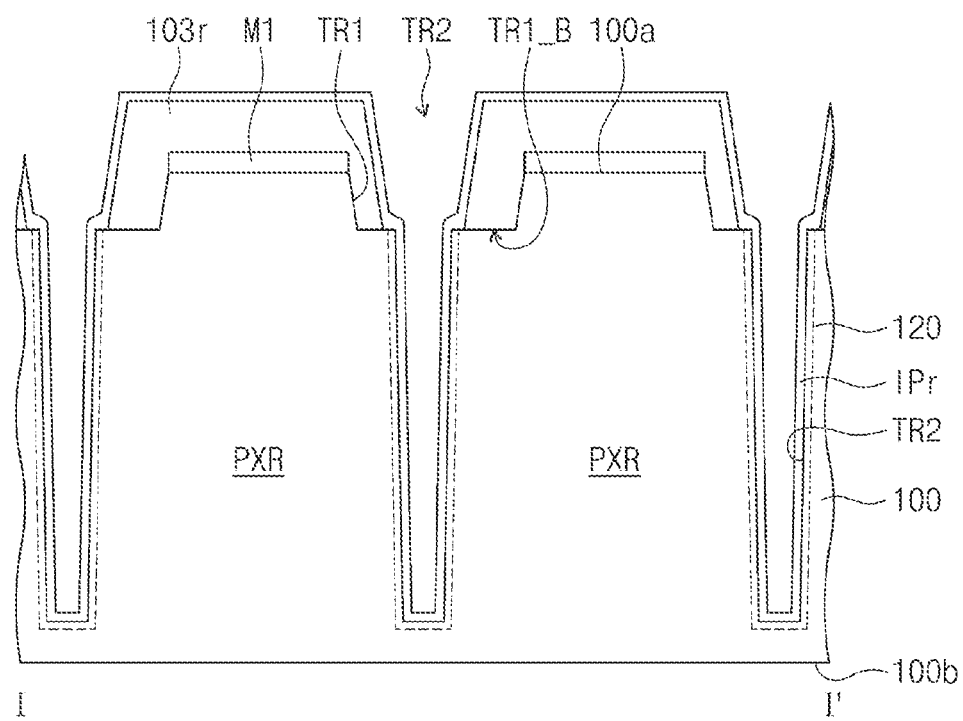
Figure 9:
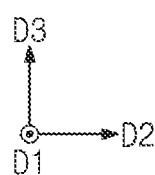

Referring to FIGS. 3 and 9, the doped region 120 may be formed in the substrate 100 exposed to the second trench TR2. The formation of the doped region 120 may include, for example, implanting impurities having a first conductivity type (e.g., P-type) into the substrate 100 exposed to the second trench TR2.

A dielectric layer IPr may be formed on the isolation layer 103r and may conformally cover an inner surface of the second trench TR2. The dielectric layer IPr may partially cover the bottom surface TR1_B of the first trench TR1, the bottom surface TR1_B being exposed to the second trench TR2. The dielectric layer IPr may include, for example, an oxide (e.g., silicon oxide).

Figure 10:
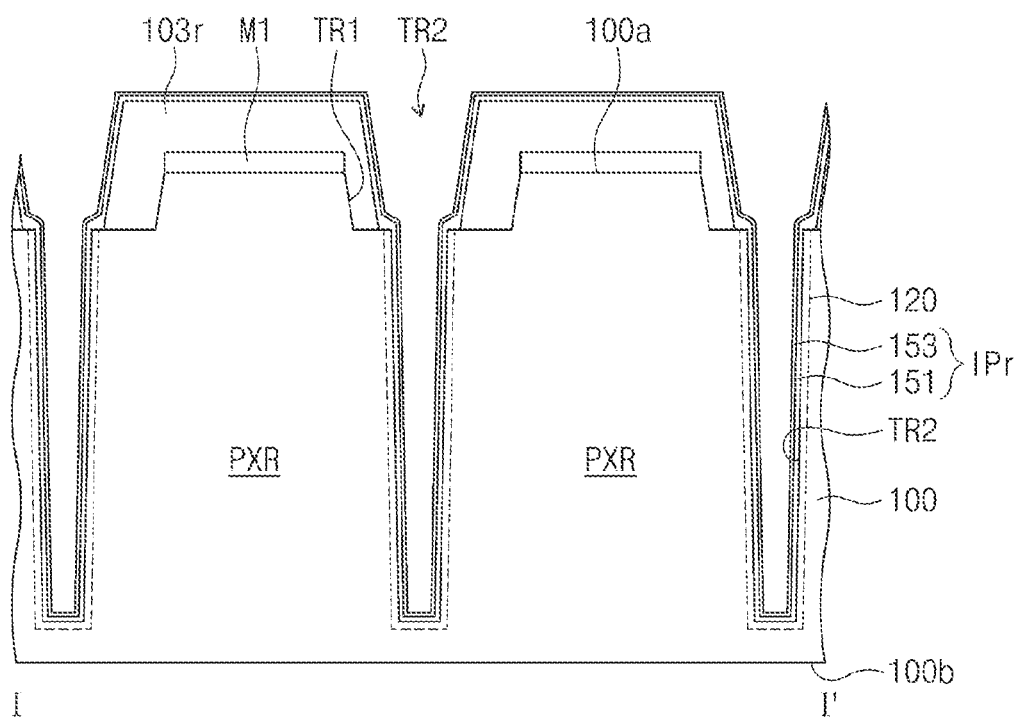
Figure 10:
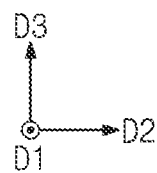

Referring to FIGS. 3 and 10, a nitridation process may be performed to nitride a surface of the dielectric layer IPr. The nitridation process may include, for example, using ion implantation or plasma treatment to implant nitrogen elements into the surface of the dielectric layer IPr. The nitridation process may cause the dielectric layer IPr to separate into the first part 153 and the second part 151 that include different materials from each other. The first part 153 of the dielectric layer IPr may include, for example, one or more of a nitride and an oxynitride, and the second part 151 of the dielectric layer IPr may include, for example, an oxide. For example, the first part 153 of the dielectric layer IPr may include one or more of silicon nitride and silicon oxynitride, and the second part 151 of the dielectric layer IPr may include silicon oxide. According to embodiments, the first part 153 of the dielectric layer IPr may include a nitrogen element, and the second part 151 of the dielectric layer IPr does not include a nitrogen element (e.g., is free of a nitrogen element). As described with reference to FIG. 5A, the first part 153 of the dielectric layer IPr may be formed to have a thickness less than that of the second part 151 of the dielectric layer IPr. In addition, because the nitridation process is performed by using ion implantation or plasma treatment, as described with reference to FIG. 5B, the first part 153 of the dielectric layer IPr may have a nitrogen concentration that decreases in a direction from a surface S1 of the first part 153 toward the second part 151.

Figure 11:
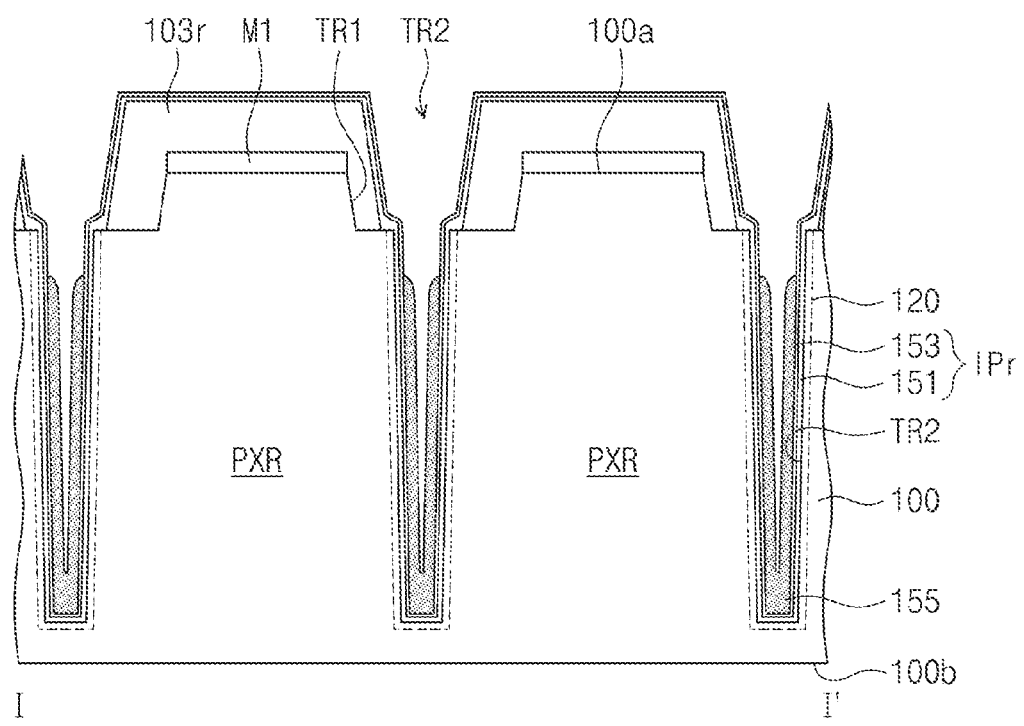
Figure 11:
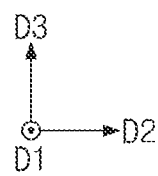

Referring to FIGS. 3 and 11, the first semiconductor pattern 155 may be formed to fill a portion of the second trench TR2. The formation of the first semiconductor pattern 155 may include, for example, forming, on the dielectric layer IPr, a first semiconductor layer that fills a portion of the second trench TR2, and performing an anisotropic etching process on the first semiconductor layer. The anisotropic etching process may remove the first semiconductor layer from an upper portion of the second trench TR2, thereby exposing the dielectric layer IPr. The first semiconductor pattern 155 may be locally formed in a lower portion of the second trench TR2 that extends into the substrate 100. The formation of the first semiconductor pattern 155 may further include implanting impurities having the first conductivity type (e.g., P-type) into the first semiconductor pattern 155. After the formation of the first semiconductor pattern 155, a cleaning process may be performed to remove etch byproducts resulting from the anisotropic etching process.

The impurities having the first conductivity type doped into the first semiconductor pattern 155 may diffuse into the dielectric layer IPr in a subsequent annealing process. In this case, the impurities diffused into the dielectric layer IPr may serve as trap sites, and thus, may contribute to white spots in the image sensor. Moreover, during the cleaning process, the exposed dielectric layer IPr may be partially removed from an upper portion of the second trench TR2, and as a result, a reduction in thickness of the dielectric layer IPr may occur. Such a reduction in thickness of the dielectric layer IPr may induce an increase in electric field applied to the dielectric layer IPr, thereby accelerating formation of the white spots.

According to embodiments of the present inventive concept, the nitrided first part 153 of the dielectric layer IPr may prevent the impurities having the first conductivity type from diffusing from the first semiconductor pattern 155 into the second part 151 of the dielectric layer IPr, or may reduce the diffusion of such impurities. Accordingly, formation of electron trap sites in the dielectric layer IPr may be suppressed. Furthermore, the nitrided first part 153 may prevent the dielectric layer IPr from undergoing a reduction in thickness in an upper portion of the second trench TR2 during the cleaning process, or may reduce such a reduction in thickness. As a result, the image sensor may prevent or reduce the occurrence of a white spot(s).

Figure 12:
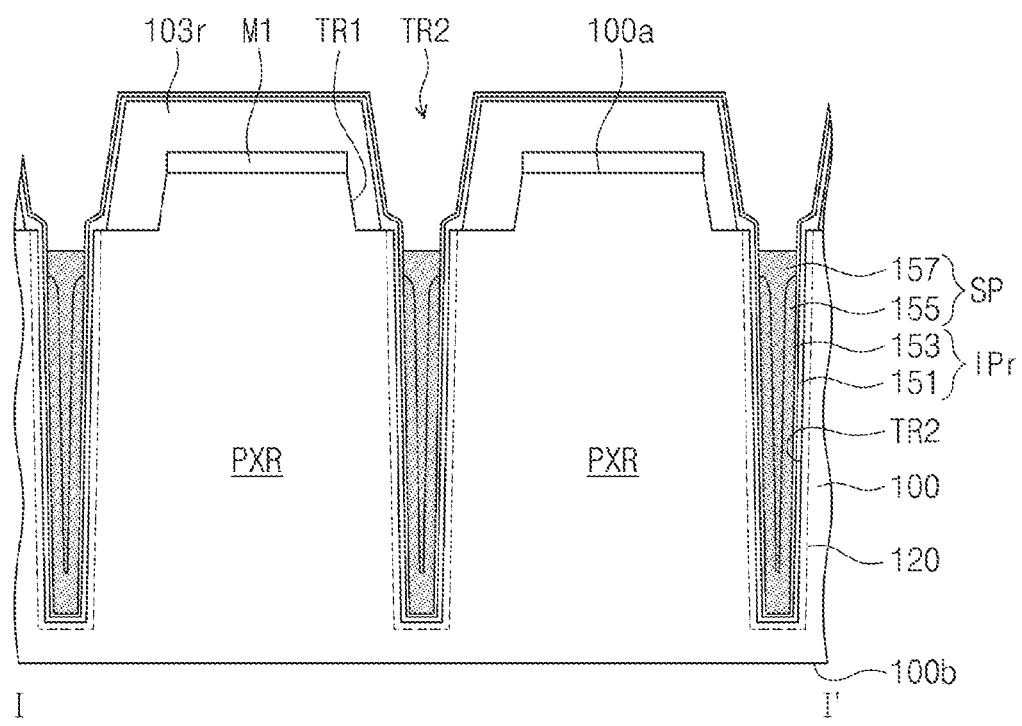

Referring to FIGS. 3 and 12, the second semiconductor pattern 157 may be formed to fill a lower portion of the second trench TR2. The formation of the second semiconductor pattern 157 may include, for example, forming, on the dielectric layer IPr, a second semiconductor layer that fills the second trench TR2, and performing an etch-back process on the second semiconductor layer. The etch-back process may continue until the second semiconductor layer remains locally in a lower portion of the second trench TR2. The second semiconductor pattern 157 may cover an uppermost surface of the first semiconductor pattern 155, and may contact the dielectric layer IPr (or the first part 153 of the dielectric layer IPr). After the formation of the second semiconductor pattern 157, an annealing process may be performed on the substrate 100. Therefore, the first conductivity impurities may diffuse into the second semiconductor pattern 157 from the first semiconductor pattern 155. The first semiconductor pattern 155 and the second semiconductor pattern 157 may be collectively referred to as a semiconductor pattern SP.

Figure 13:
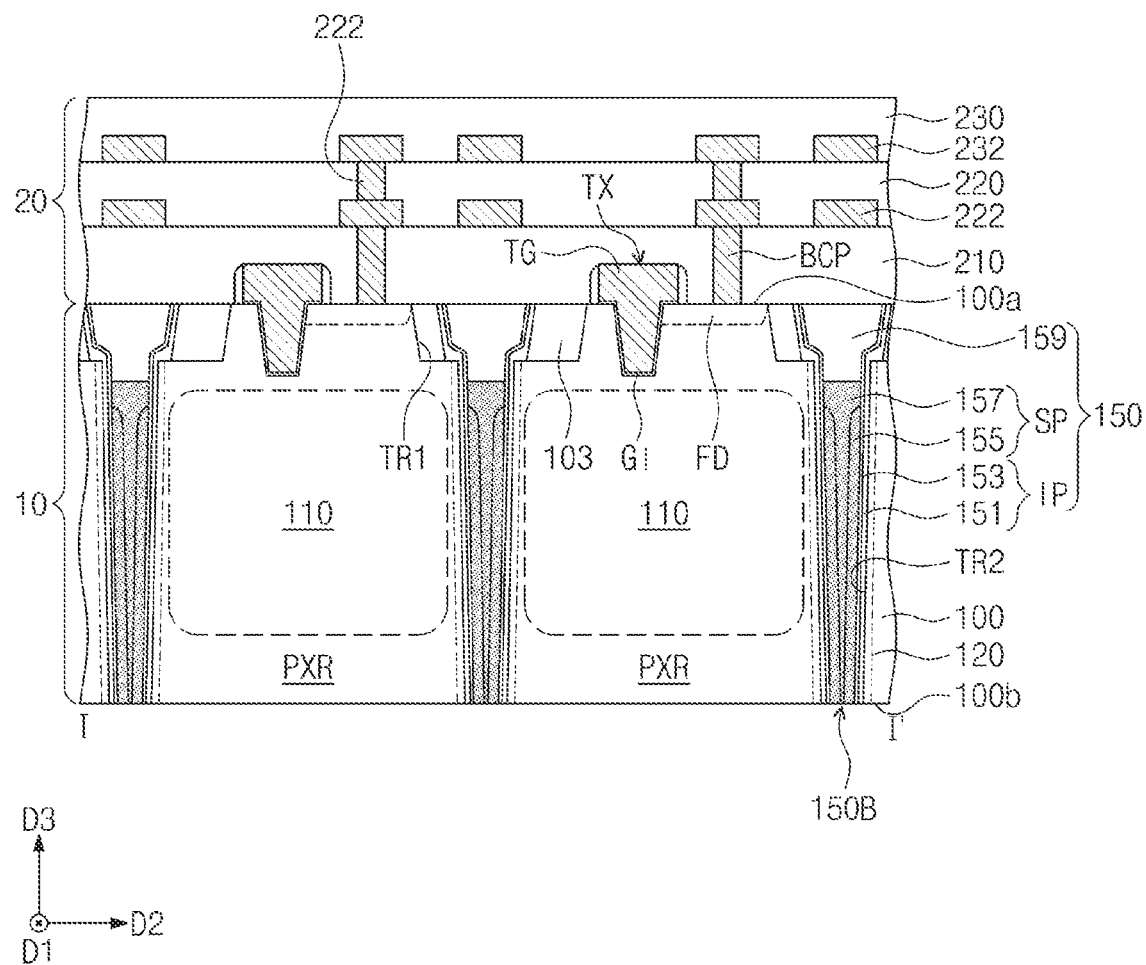

Referring to FIGS. 3 and 13, the buried dielectric pattern 159 may be formed to fill an upper portion of the second trench TR2. The formation of the buried dielectric pattern 159 may include, for example, forming, on the substrate 100 in which the semiconductor pattern SP is formed, a buried dielectric layer that fills a remaining portion of the second trench TR2, and performing a planarization process on the buried dielectric layer, the dielectric layer IPr, and the isolation layer 103r until the first surface 100a of the substrate 100 is exposed. The planarization process may remove the first mask pattern M1. The planarization process may convert the buried dielectric layer, the dielectric layer IPr, and the isolation layer 103r into the buried dielectric pattern 159, the dielectric pattern IP, and the shallow isolation pattern 103. The buried dielectric pattern 159, the dielectric pattern IP, and the semiconductor pattern SP may be collectively referred to as the deep isolation pattern 150. The deep isolation pattern 150 may be interposed between the plurality of pixel regions PXR.

According to embodiments of the present inventive concept, the first part 153 of the dielectric pattern IP may be formed by implanting nitrogen elements into a surface of the dielectric layer IPr. Compared to a case where an additional dielectric layer is deposited on the dielectric layer IPr, this may facilitate a reduction in size (e.g., a reduction in the width in the second direction D2) of the deep isolation pattern 150, and accordingly, an increase in the integration of the plurality of pixel regions PXR may be achieved.

The photoelectric conversion region 110 may be formed in each of the plurality of pixel regions PXR. The formation of the photoelectric conversion region 110 may include, for example, implanting the substrate 100 with impurities having a second conductivity type (e.g., N-type) different from the first conductivity type (e.g., P-type).

A thinning process may be performed on the second surface 100b of the substrate 100, and the thinning process may partially remove the substrate 100 and the deep isolation pattern 150. The thinning process may include, for example, grinding or polishing the second surface 100b of the substrate 100, and anisotropically and/or isotropically etching the second surface 100b of the substrate 100. The thinning process may remove a lower portion of the deep isolation pattern 150, and the bottom surface 150B of the deep isolation pattern 150 may be substantially coplanar with the second surface 100b of the substrate 100.

Transistors TX, RX, SX, and DX may be formed on the first surface 100a of the substrate 100 and on each pixel region PXR. The formation of the transfer transistor TX may include, for example, implanting a corresponding active region ACT with impurities to form a floating diffusion region FD, and forming a transfer gate TG on the corresponding active region ACT. The formation of the drive, select, and reset transistors DX, SX, and RX may include implanting a corresponding active region ACT with impurities to form an impurity region, and forming, on the corresponding active region ACT, a corresponding one of driver, select, and reset gates SFG, SG, and RG.

The process described above may form the photoelectric conversion layer 10. The wiring layer 20 may be formed on the first surface 100a of the substrate 100. For example, the first interlayer dielectric layer 210 may be formed on the first surface 100a of the substrate 100, and may cover the transistors TX, RX, SX, and DX. The contact plugs BCP may be formed in the first interlayer dielectric layer 210, and may be connected to terminals of the transistors TX, RX, SX, and DX. The second interlayer dielectric layer 220 and the third interlayer dielectric layer 230 may be sequentially formed on the first interlayer dielectric layer 210. The first wiring patterns 222 and the second wiring patterns 232 may be formed in the second interlayer dielectric layer 220 and the third interlayer dielectric layer 230, respectively. The first and second wiring patterns 222 and 232 may be electrically connected through the contact plugs BCP to the transistors TX, RX, SX, and DX.

Referring back to FIGS. 3 and 4, the optical transmittance layer 30 may be formed on the second surface 100b of the substrate 100. For example, the antireflection layer 310 and the first dielectric layer 312 may be sequentially formed on the second surface 100b of the substrate 100. The grid 315 may be formed on the first dielectric layer 312, and may vertically overlap the deep isolation pattern 150. The formation of the grid 315 may include, for example, depositing a metal layer on the first dielectric layer 312, and patterning the metal layer. The color filter array 320 may be formed on the first dielectric layer 312 and may cover the grid 315. The color filter array 320 may include a plurality of color filters, and the plurality of color filters of the color filter array 320 may be correspondingly disposed on the plurality of pixel regions PXR. The second dielectric layer 322 may be formed on the color filter array 320, and the micro-lens array 330 may be formed on the second dielectric layer 322. The micro-lens array 330 may include a plurality of micro-lenses that are correspondingly disposed on the plurality of color filters of the color filter array 320. Each of the plurality of micro-lenses of the micro-lens array 330 may be disposed to vertically overlap (e.g., in the third direction D3) the photoelectric conversion region 110 of a corresponding pixel region PXR.

Figure 14:
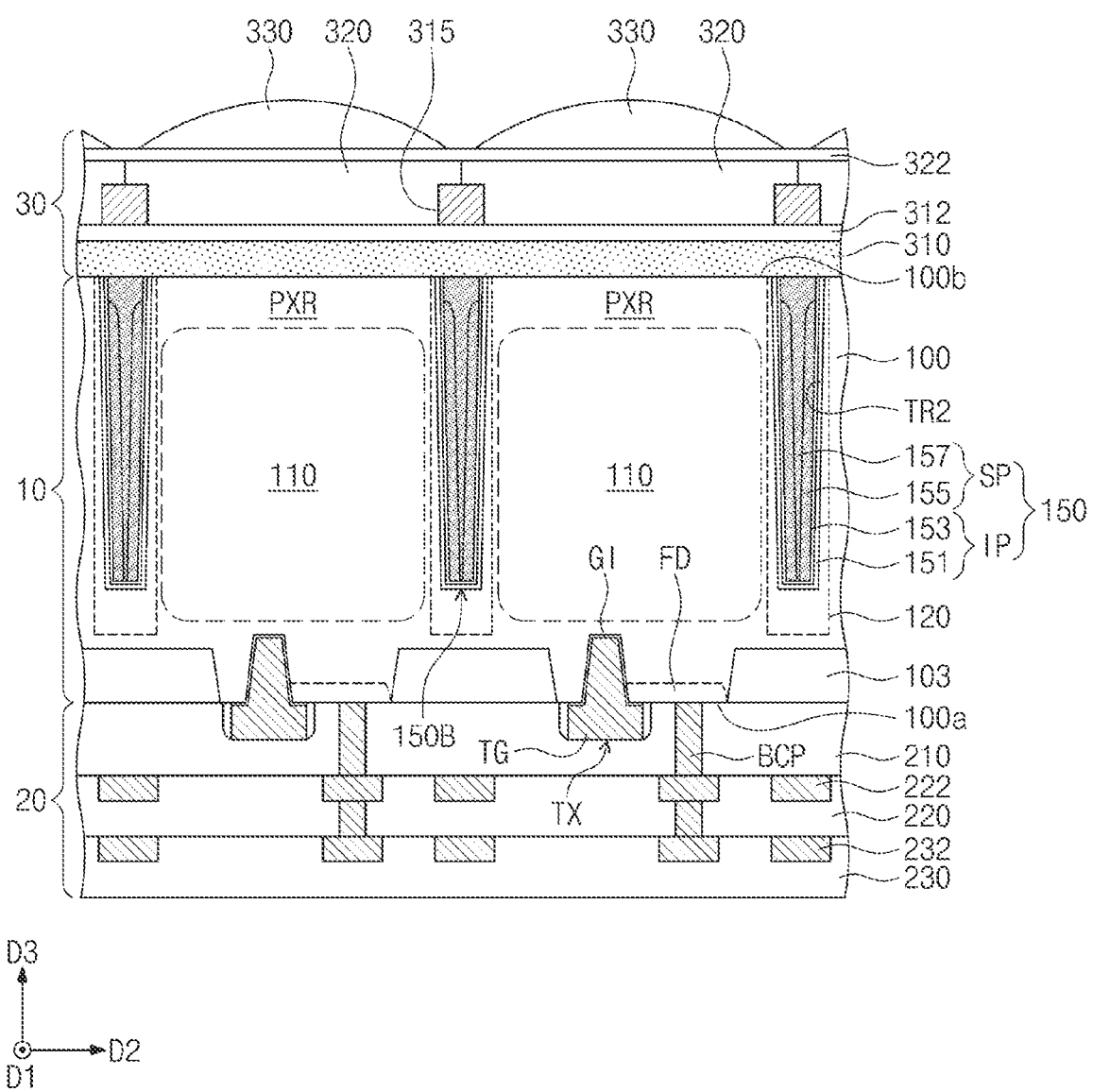
FIG. 14 illustrates a cross-sectional view showing an image sensor according to embodiments of the present inventive concept.

FIG. 14 illustrates a cross-sectional view showing an image sensor according to embodiments of the present inventive concept. For brevity, a further description of elements and technical aspects previously described may be omitted, and the following description will focus on differences from the image sensor described with reference to FIGS. 1 to 5B.

Referring to FIG. 14, the photoelectric conversion layer 10 may include a substrate 100 that includes a plurality of pixel regions PXR, and may also include a deep isolation pattern 150 disposed in the substrate 100 between the plurality of pixel regions PXR. According to embodiments, the deep isolation pattern 150 may extend from a second surface 100b of the substrate 100 toward a first surface 100a of the substrate 100, and may have a bottom surface 150B at a higher level than that of the first surface 100a of the substrate 100. In this description, the level of the bottom surface 150B of the substrate 100 may be a distance measured from the first surface 100a of the substrate 100 and measured in a direction (e.g., the third direction D3) substantially perpendicular to the first surface 100a of the substrate 100.

The deep isolation pattern 150 may include a semiconductor pattern SP that penetrates a portion of the substrate 100, and may also include a dielectric pattern IP interposed between the semiconductor pattern SP and the substrate 100. The semiconductor pattern SP may be disposed between the plurality of pixel regions PXR, and the dielectric pattern IP may be interposed between the semiconductor pattern SP and each of the plurality of pixel regions PXR. According to embodiments, the dielectric pattern IP may be interposed between each of the plurality of pixel regions PXR and a lateral surface of the semiconductor pattern SP, and may extend between the substrate 100 and a bottom surface of the semiconductor pattern SP. The dielectric pattern IP may have a bottom surface that corresponds to a bottom surface 150B of the deep isolation pattern 150 and is located at a higher level than that of the first surface 100a of the substrate 100.

According to embodiments, the uppermost surfaces of the dielectric pattern IP and the semiconductor pattern SP may be substantially coplanar with the second surface 100b of the substrate 100. For example, the uppermost surfaces of the dielectric pattern IP and the semiconductor pattern SP may be located at substantially the same level as that of the second surface 100b of the substrate 100. In this description, the level may be a distance measured from the first surface 100a of the substrate 100 and measured in a direction (e.g., the third direction D3) substantially perpendicular to the first surface 100a of the substrate 100. According to embodiments, differently from that shown, the deep isolation pattern 150 may further include the buried dielectric pattern 159 described with reference to FIG. 4, and the buried dielectric pattern IP may extend from the lateral surface of the semiconductor pattern SP onto a lateral surface of the buried dielectric pattern 159.

The semiconductor pattern SP may include a first semiconductor pattern 155 adjacent to the dielectric pattern IP and a second semiconductor pattern 157 disposed on the dielectric pattern IP across the first semiconductor pattern 155. The second semiconductor pattern 157 may cover an uppermost surface of the first semiconductor pattern 155 and may contact the dielectric pattern IP. The dielectric pattern IP may include a first part 153 adjacent to the semiconductor pattern SP and a second part 151 adjacent to the substrate 100. According to embodiments, the first part 153 of the dielectric pattern IP may be adjacent to the lateral and bottom surfaces of the semiconductor pattern SP, and the second part 151 of the dielectric pattern IP may be spaced apart from the lateral and bottom surfaces of the semiconductor pattern SP across the first part 153 of the dielectric pattern IP.

Each of the plurality of pixel regions PXR may include a photoelectric conversion region 110 and a doped region 120 that extends along a lateral surface of the deep isolation pattern 150. The doped region 120 may be disposed between the photoelectric conversion region 110 and the deep isolation pattern 150. According to embodiments, the doped region 120 may extend along the bottom surface 150B of the deep isolation pattern 150.

A shallow isolation pattern 103 may be disposed adjacent to the first surface 100a of the substrate 100. According to embodiments, the deep isolation pattern 150 (or the bottom surface 150B thereof) may be spaced apart from the shallow isolation pattern 103.

The transfer transistor TX and the logic transistors RX, SX, and DX of FIG. 3 may be disposed on the first surface 100a of the substrate 100. A wiring layer 20 may be disposed on the first surface 100a of the substrate 100, and an optical transmittance layer 30 may be disposed on the second surface 100b of the substrate 100. Except for the differences described above, an image sensor according to an embodiment described with reference to FIG. 14 may be substantially the same as the image sensor according to an embodiment described with reference to FIGS. 1 to 5B.

Figure 15:
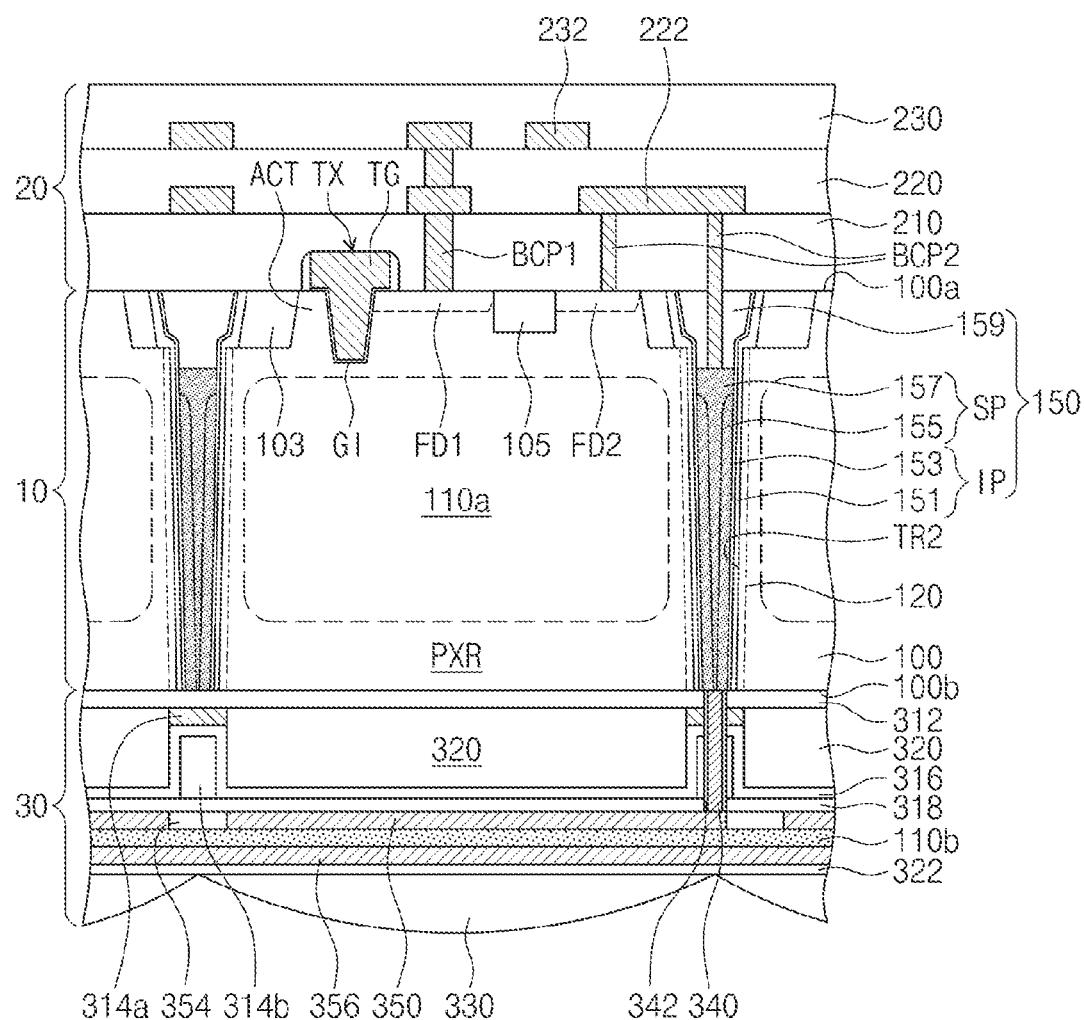
FIG. 15 illustrates a cross-sectional view showing an image sensor according to embodiments of the present inventive concept.

FIG. 15 illustrates a cross-sectional view showing an image sensor according to embodiments of the present inventive concept. For brevity, a further description of elements and technical aspects previously described may be omitted, and the following description will focus on differences from the image sensor described with reference to FIGS. 1 to 5B.

Referring to FIG. 15, the photoelectric conversion layer 10 may include a substrate 100 that includes a plurality of pixel regions PXR, and may also include deep isolation patterns 150 disposed in the substrate 100 between the plurality of pixel regions PXR. Each of the deep isolation patterns 150 may include a semiconductor pattern SP that penetrates at least a portion of the substrate 100, a dielectric pattern IP interposed between the semiconductor pattern SP and the substrate 100, and a buried dielectric pattern 159 on the semiconductor pattern SP. Each of the deep isolation patterns 150 may be substantially the same as the deep isolation pattern 150 described with reference to FIGS. 1 to 5B.

First and second shallow isolation patterns 103 and 105 may be disposed adjacent to the first surface 100a of the substrate 100. Each of the plurality of pixel regions PXR may include active regions ACT defined by the first shallow isolation pattern 103, and the second shallow isolation pattern 105 may be disposed in a corresponding active region ACT. Each of the deep isolation patterns 150 may penetrate the first shallow isolation pattern 103 and may penetrate and extend into the substrate 100. For example, the buried dielectric pattern 159 of each of the deep isolation patterns 150 may be disposed in the first shallow isolation pattern 103. The buried dielectric pattern 159 may penetrate the first shallow isolation pattern 103 and may contact the semiconductor pattern SP. The dielectric pattern IP of each of the deep isolation patterns 150 may extend between the first shallow isolation pattern 103 and the buried dielectric pattern 159.

The transfer transistor TX and the logic transistors RX, SX, and DX of FIG. 3 may be disposed on the first surface 100a of the substrate 100. The transfer transistor TX may include a transfer gate TG and a first floating diffusion region FD1 on a corresponding active region ACT. The first floating diffusion region FD1 may be disposed in the corresponding active region ACT on one side of the transfer gate TG. A second floating diffusion region FD2 may be disposed in the corresponding active region ACT, and the second shallow isolation pattern 105 may be interposed between the first floating diffusion region FD1 and the second floating diffusion region FD2. The first and second floating diffusion regions FD1 and FD2 may be regions doped with impurities having a second conductivity type (e.g., N-type) different from a first conductivity type of the substrate 100.

A wiring layer 20 may be disposed on the first surface 100a of the substrate 100. The wiring layer 20 may include a first interlayer dielectric layer 210, a second interlayer dielectric layer 220, and a third interlayer dielectric layer 230 that are sequentially stacked on the first surface 100a of the substrate 100. The wiring layer 20 may further include first and second contact plugs BCP1 and BCP2 in the first interlayer dielectric layer 210, first wiring patterns 222 in the second interlayer dielectric layer 220, and second wiring patterns 232 in the third interlayer dielectric layer 230. The first contact plugs BCP1 may be connected to terminals of the transistors TX, RX, SX, and DX. The semiconductor pattern SP of one deep isolation pattern 150 may be electrically connected to the second floating diffusion region FD2 through the second contact plug BCP2 and the first wiring pattern 222. The semiconductor pattern SP of another deep isolation pattern 150 may be electrically separated (or insulated) from the semiconductor pattern SP of one deep isolation patterns 150.

Each of the plurality of pixel regions PXR may include a first photoelectric conversion region 110a. The first photoelectric conversion region 110a may be a region doped with impurities having the second conductivity type (e.g., N-type) different from the first conductivity type of the substrate 100. The first photoelectric conversion region 110a and the substrate 100 may form a PN junction to constitute a photodiode.

An optical transmittance layer 30 may be disposed on the second surface 100b of the substrate 100. The optical transmittance layer 30 may include a color filter array 320 and a micro-lens array 330 on the second surface 100b of the substrate 100. The color filter array 320 may be disposed between the micro-lens array 330 and the second surface 100b of the substrate 100. The color filter array 320 may include a plurality of color filters that are correspondingly disposed on the plurality of pixel regions PXR, and the micro-lens array 330 may include a plurality of micro-lenses that are correspondingly disposed on the plurality of color filters of the color filter array 320.

A first dielectric layer 312 may be disposed between the color filter array 320 and the second surface 100b of the substrate 100. Light-shield patterns 314a may be disposed on the first dielectric layer 312 between the plurality of color filters of the color filter array 320. Low-refraction patterns 314b may be disposed between the plurality of color filters of the color filter array 320, and may be disposed on corresponding light-shield patterns 314a. A third dielectric layer 316 may be interposed between each of the light-shield patterns 314a and each of the low-refraction patterns 314b. The third dielectric layer 316 may extend between the micro-lens array 330 and each of the plurality of color filters of the color filter array 320.

Pixel electrodes 350 may be correspondingly disposed on the plurality of pixel regions PXR. The pixel electrodes 350 may be correspondingly disposed on the plurality of color filters of the color filter array 320, and the third dielectric layer 316 may be interposed between the pixel electrodes 350 and the color filters of the color filter array 320. Electrode separation patterns 354 may be disposed between the pixel electrodes 350. A fourth dielectric layer 318 may be disposed between the third dielectric layer 316 and the pixel electrodes 350, and may extend between the electrode separation patterns 354 and the low-refraction patterns 314b.

A second photoelectric conversion layer 110b may be disposed between the pixel electrodes 350 and the electrode separation patterns 354, and a common electrode 356 may be disposed on the second photoelectric conversion layer 110b. The second photoelectric conversion layer 110b may be disposed between the common electrode 356 and the pixel electrodes 350 and between the common electrode 356 and the electrode separation patterns 354. The color filter array 320 and the micro-lens array 330 may be provided therebetween with the pixel electrodes 350, the electrode separation patterns 354, the second photoelectric conversion layer 110b, and the common electrode 356. The second photoelectric conversion layer 110b may be, for example, an organic photoelectric conversion layer. The second photoelectric conversion layer 110b may include a P-type organic semiconductor material and an N-type organic semiconductor material, which may form a PN junction. Alternatively, the second photoelectric conversion layer 110b may include quantum-dots or chalcogenide. The pixel electrodes 350 and the common electrode 356 may include, for example, one or more of indium tin oxide (ITO), indium zinc oxide (IZO), zinc oxide (ZnO), and an organic transparent conductive material.

Each of the pixel electrodes 350 may be electrically connected to the semiconductor pattern SP of one deep isolation pattern 150 through a via plug 340. The via plug 340 may be connected to the semiconductor pattern SP of one deep isolation pattern 150, and may be connected to a corresponding one of the pixel electrodes 350 after penetrating the first dielectric layer 312, a corresponding light-shield pattern 314a, the third dielectric layer 316, a corresponding low-refraction pattern 314b, and the fourth dielectric layer 318. A via barrier layer 342 may be between the via plug 340 and each of the first dielectric layer 312, the corresponding light-shield pattern 314a, the third dielectric layer 316, the corresponding low-refraction pattern 314b, and the fourth dielectric layer 318. The semiconductor pattern SP of one deep isolation pattern 150 may be electrically connected to the second floating diffusion region FD2 through the second contact plug BCP2 and the first wiring pattern 222.

A second dielectric layer 322 may be interposed between the common electrode 356 and the micro-lens array 330. The first, second, third, and fourth dielectric layers 312, 316, 318, and 322 and the electrode separation patterns 354 may include, for example, one or more of a silicon oxide layer, a silicon nitride layer, and a silicon oxynitride layer.

Except for the differences described above, an image sensor according to an embodiment described with reference to FIG. 15 may be substantially the same as the image sensor according to an embodiment described with reference to FIGS. 1 to 5B.

Figure 16:
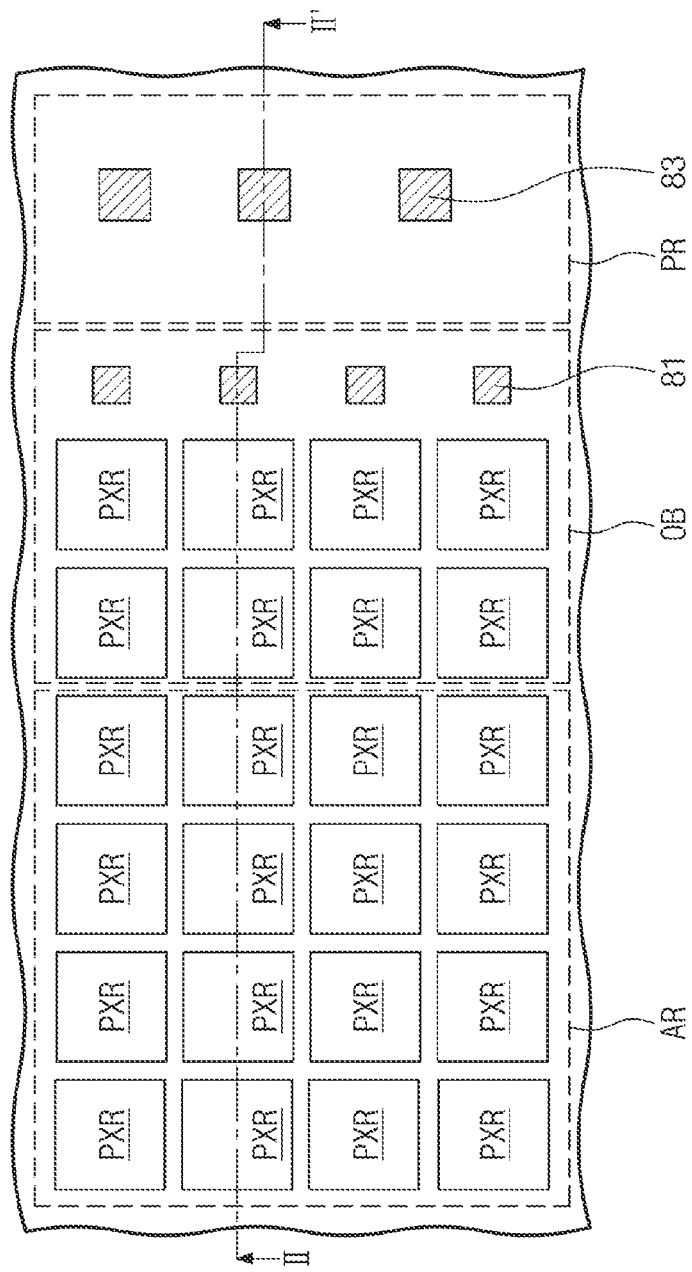
FIG. 16 illustrates a plan view showing an image sensor according to embodiments of the present inventive concept.
Figure 17:
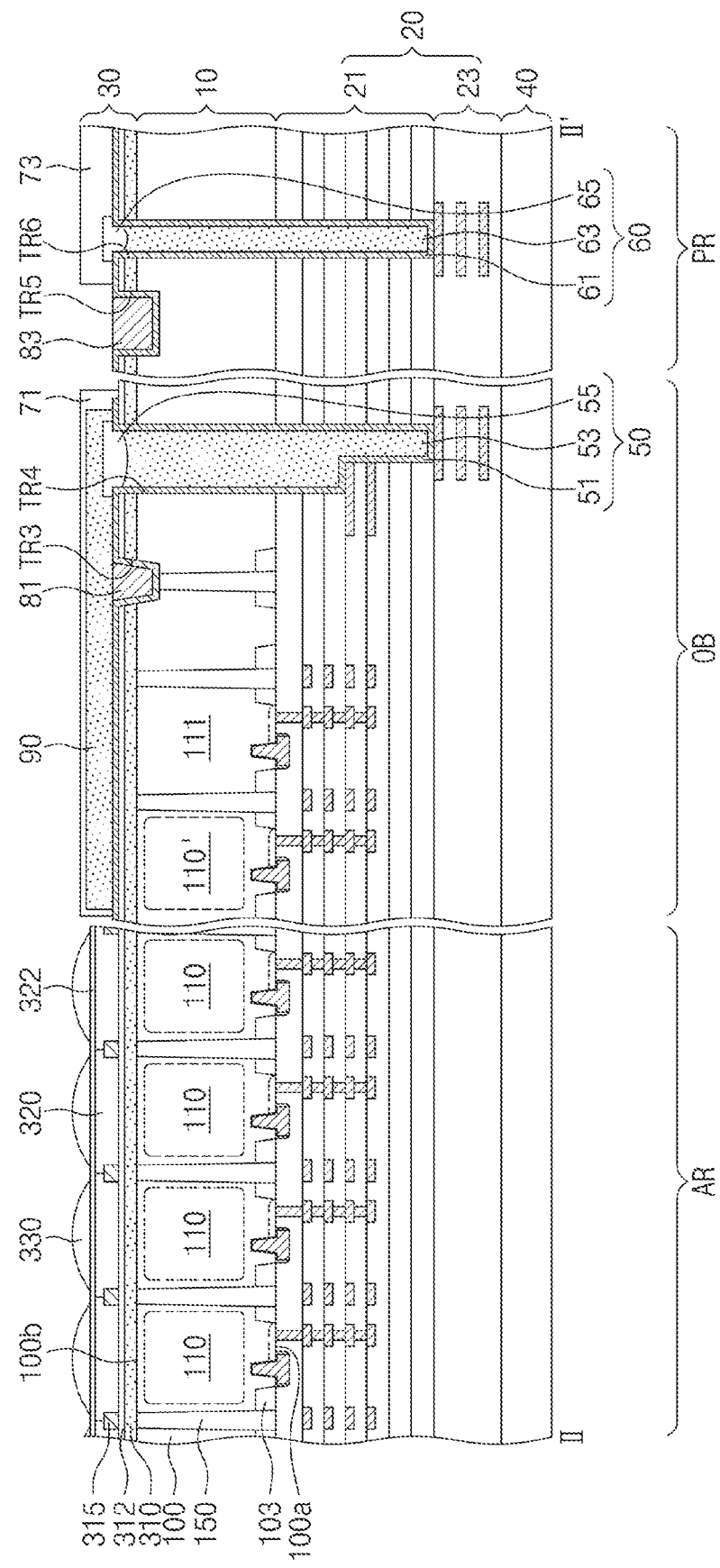
FIG. 17 illustrates a cross-sectional view taken along line II-II' of FIG. 16 according to embodiments of the present inventive concept.

FIG. 16 illustrates a plan view showing an image sensor according to embodiments of the present inventive concept. FIG. 17 illustrates a cross-sectional view taken along line II-IP of FIG. 16. For brevity, a further description of elements and technical aspects previously described may be omitted, and the following description will focus on differences from the image sensor described with reference to FIGS. 1 to 5B.

Referring to FIGS. 16 and 17, an image sensor may include a substrate 100 including a pixel array region AR, an optical black region OB, and a pad region PR, a wiring layer 20 on a first surface 100a of the substrate 100, a base substrate 40 on the wiring layer 20, and an optical transmittance layer 30 on a second surface 100b of the substrate 100. The wiring layer 20 may be disposed between the base substrate 40 and the first surface 100a of the substrate 100. The wiring layer 20 may include an upper wiring layer 21 adjacent to the first surface 100a of the substrate 100, and may also include a lower wiring layer 23 between the upper wiring layer 21 and the base substrate 40. The pixel array region AR may include a plurality of pixel regions PXR and a deep isolation pattern 150 disposed between the plurality of pixel regions PXR. The pixel array region AR may be substantially the same as the pixel array region AR described with reference to FIGS. 1 to 5B, 14, and 15. For example, the deep isolation pattern 150 may be substantially the same as one of the deep isolation patterns 150 described with reference to FIGS. 1 to 5B, 14, and 15.

A first connection structure 50, a first contact 81, and a bulk color filter 90 may be disposed on the optical black region OB of the substrate 100. The first connection structure 50 may include a first light-shield pattern 51, a first separation pattern 53, and a first capping pattern 55. The first light-shield pattern 51 may be disposed on the second surface 100b of the substrate 100. The first light-shield pattern 51 may cover the first dielectric layer 312, and may conformally cover an inner wall of one of third and fourth trenches TR3 and TR4. The first light-shield pattern 51 may penetrate the photoelectric conversion layer 10 and the upper wiring layer 21. The first light-shield pattern 51 may be connected to the semiconductor pattern SP of the deep isolation pattern 150 included in the photoelectric conversion layer 10, and may be connected to wiring lines in the upper and lower wiring layers 21 and 23. Therefore, the first connection structure 50 may electrically connect the photoelectric conversion layer 10 to the wiring layer 20. The first light-shield pattern 51 may include a metallic material (e.g., tungsten). The first light-shield pattern 51 may block light incident onto the optical black region OB.

The first contact 81 may fill a remaining portion the third trench TR3. The first contact 81 may include a metallic material (e.g., aluminum). The first contact 81 may be connected to the semiconductor pattern SP of the deep isolation pattern 150. A bias may be applied through the first contact 81 to the semiconductor pattern SP. The first separation pattern 53 may fill a remaining portion of the fourth trench TR4. The first separation pattern 53 may penetrate the photoelectric conversion layer 10 and a portion of the wiring layer 20. The first separation pattern 53 may include a dielectric material. The first capping pattern 55 may be disposed on the first separation pattern 53. The first capping pattern 55 may include the same material as that of the buried dielectric pattern 159 shown in FIG. 4.

The bulk color filter 90 may be disposed on the first connection structure 50 and the first contact 81. The bulk color filter 90 may cover the first connection structure 50 and the first contact 81. A first passivation layer 71 may lie on and encapsulate the bulk color filter 90.

An additional photoelectric conversion region 110' and a dummy region 111 may each be provided in a corresponding pixel region PXR of the optical black region OB. The additional photoelectric conversion region 110' may be a region doped with impurities having a conductivity type (e.g., N-type) different from a first conductivity type of the substrate 100. According to embodiments, the additional photoelectric conversion region 110' may have a structure similar to that of the photoelectric conversion regions 110 in the plurality of pixel regions PXR of the pixel array region AR, but does not perform the same operation (e.g., reception of light and generation of electrical signals) as that of the photoelectric conversion regions 110. According to embodiments, the dummy region 111 is not doped with impurities.

A second connection structure 60, a second contact 83, and a second passivation layer 73 may be disposed in the pad region PR of the substrate 100. The second connection structure 60 may include a second light-shield pattern 61, a second separation pattern 63, and a second capping pattern 65.

The second light-shield pattern 61 may be disposed on the second surface 100b of the substrate 100. The second light-shield pattern 61 may cover the first dielectric layer 312, and may conformally cover an inner wall of each of fifth and sixth trenches TR5 and TR6. The second light-shield pattern 61 may penetrate the photoelectric conversion layer 10 and the upper wiring layer 21. The second light-shield pattern 61 may be connected to wiring lines in the lower wiring layer 23. Therefore, the second connection structure 60 may electrically connect the photoelectric conversion layer 10 to the wiring layer 20. The second light-shield pattern 61 may include a metallic material (e.g., tungsten). The second light-shield pattern 61 may block light incident onto the pad region PR.

The second contact 83 may fill a remaining portion of the fifth trench TR5. The second contact 83 may include a metallic material (e.g., aluminum). The second contact 83 may serve as an electrical connection path between the image sensor and an external device. The second separation pattern 63 may fill a remaining portion of the sixth trench TR6. The second separation pattern 63 may penetrate the photoelectric conversion layer 10 and a portion of the wiring layer 20. The second separation pattern 63 may include a dielectric material. The second capping pattern 65 may be disposed on the second separation pattern 63. The second capping pattern 65 may include the same material as that of the buried dielectric pattern 159 shown in FIG. 4. The second passivation layer 73 may cover the second connection structure 60.

A current applied through the second contact 83 may flow through the second light-shield pattern 61, wiring lines in the wiring layer 20, and the first light-shield pattern 51 to the semiconductor pattern SP of the deep isolation pattern 150. Electrical signals generated from the photoelectric conversion regions 110 in the plurality of pixel regions PXR of the pixel array region AR may be externally transferred through wiring lines in the wiring layer 20, the second light-shield pattern 61, and the second contact 83.

According to embodiments of the present inventive concept, a nitrided first part of a dielectric pattern included in a deep isolation pattern may prevent impurities from diffusing from a semiconductor pattern into a second part of the dielectric pattern, or may reduce such diffusion. Accordingly, the formation of electron trap sites in the dielectric pattern may be suppressed. In addition, the first part may suppress a reduction in thickness of the dielectric pattern during a cleaning process. As a result, an image sensor in which the occurrence of a white spot(s) is prevented or reduced may be provided.

Furthermore, the first part of the dielectric pattern may be formed by performing a nitridation process on a surface of a dielectric layer. Compared to a case in which an additional dielectric layer is deposited, this process may facilitate a reduction in size of the deep isolation pattern, and a highly-integrated image sensor may be provided.

While the present inventive concept has been particularly shown and described with reference to the embodiments thereof, it will be understood by those of ordinary skill in the art that various changes in form and detail may be made therein without departing from the spirit and scope of the present inventive concept as defined by the following claims.

What is claimed is:

1. An image sensor, comprising:
    a substrate that comprises a plurality of pixel regions; and
    a deep isolation pattern disposed in the substrate between the plurality of pixel regions,
    wherein the deep isolation pattern comprises:
        a semiconductor pattern that penetrates at least a portion of the substrate; and
        a dielectric pattern disposed between the substrate and the semiconductor pattern,
    wherein the dielectric pattern comprises:
        a first part disposed adjacent to the semiconductor pattern; and
        a second part disposed between the substrate and the first part,
    wherein the semiconductor pattern comprises:
        a first semiconductor pattern; and
        a second semiconductor pattern,
        wherein the first semiconductor pattern is disposed between the dielectric pattern and the second semiconductor pattern,
    wherein the first part of the dielectric pattern comprises a material different from a material of the second part of the dielectric pattern, and
    wherein a thickness of the first part of the dielectric pattern is less than a thickness of the second part of the dielectric pattern.

2. The image sensor of claim 1, wherein the first part of the dielectric pattern comprises one or more of a nitride and an oxynitride.

3. The image sensor of claim 2, wherein the second part of the dielectric pattern comprises an oxide.

4. The image sensor of claim 1, wherein
    the first part of the dielectric pattern comprises a nitrogen element, and
    the second part of the dielectric pattern does not comprise the nitrogen element.

5. The image sensor of claim 1, wherein the second semiconductor pattern covers an uppermost surface of the first semiconductor pattern and contacts the first part of the dielectric pattern.

6. The image sensor of claim 5, wherein the first and second semiconductor patterns comprise a semiconductor material doped with a P-type impurity or an N-type impurity.

7. The image sensor of claim 1, wherein each of the plurality of pixel regions comprises:
    a photoelectric conversion region; and
    a doped region that extends along a lateral surface of the deep isolation pattern,
    wherein the doped region is disposed between the photoelectric conversion region and the deep isolation pattern.

8. The image sensor of claim 7, wherein
    the doped region comprises an impurity having a first conductivity type, and the first and second semiconductor patterns comprise a semiconductor material doped with an impurity having the first conductivity type.

9. The image sensor of claim 1, further comprising:
a shallow isolation pattern disposed in the substrate between the plurality of pixel regions,
wherein the deep isolation pattern further comprises a buried dielectric pattern disposed on the semiconductor pattern, the buried dielectric pattern penetrating the shallow isolation pattern, and
wherein the dielectric pattern extends between the shallow isolation pattern and the buried dielectric pattern.

10. The image sensor of claim 9, wherein
the first part of the dielectric pattern is disposed adjacent to the buried dielectric pattern, and
the second part of the dielectric pattern is disposed between the first part of the dielectric pattern and the shallow isolation pattern.

11. The image sensor of claim 9, wherein
the substrate has a first surface and a second surface that are opposite to each other,
the shallow isolation pattern is disposed in a first trench that extends into the substrate from the first surface of the substrate,
the deep isolation pattern is disposed in a second trench that penetrates the shallow isolation pattern and extends toward the second surface of the substrate, and
the dielectric pattern covers a portion of a bottom surface of the first trench.

12. An image sensor, comprising:
a substrate that comprises a plurality of pixel regions; and
a deep isolation pattern disposed in the substrate between the plurality of pixel regions,
wherein the deep isolation pattern comprises:
  a semiconductor pattern disposed between the plurality of pixel regions;
  a buried dielectric pattern disposed on the semiconductor pattern; and
  a dielectric pattern disposed between the semiconductor pattern and each of the plurality of pixel regions, the dielectric pattern extending onto a lateral surface of the buried dielectric pattern,
wherein the dielectric pattern comprises:
  a first part disposed adjacent to a lateral surface of the semiconductor pattern and the lateral surface of the buried dielectric pattern; and
  a second part disposed between the first part of the dielectric pattern and each of the plurality of pixel regions,
wherein the first part of the dielectric pattern comprises a material different from a material of the second part of the dielectric pattern, and
wherein a thickness of the first part of the dielectric pattern is less than a thickness of the second part of the dielectric pattern.

13. The image sensor of claim 12, wherein
the first part of the dielectric pattern comprises a nitrogen element, and
the second part of the dielectric pattern does not comprise the nitrogen element.

14. The image sensor of claim 12, wherein the semiconductor pattern comprises a semiconductor material doped with a first impurity.

15. The image sensor of claim 14, wherein each of the plurality of pixel regions comprises:
a photoelectric conversion region; and
a doped region that extends along a lateral surface of the deep isolation pattern,
wherein the doped region is disposed between the photoelectric conversion region and the deep isolation pattern, and
wherein the doped region comprises a second impurity having a same conductivity type as a conductivity type of the first impurity doped in the semiconductor pattern.

16. The image sensor of claim 12, further comprising:
a shallow isolation pattern disposed in the substrate between the plurality of pixel regions,
wherein the buried dielectric pattern is disposed in the shallow isolation pattern, and
wherein the dielectric pattern extends between the shallow isolation pattern and the buried dielectric pattern.

17. The image sensor of claim 16, wherein
the buried dielectric pattern is in contact with the first part of the dielectric pattern, and
the shallow isolation pattern is in contact with the second part of the dielectric pattern.

18. The image sensor of claim 16, wherein
the substrate has a first surface and a second surface that are opposite to each other,
the shallow isolation pattern is disposed in a first trench that extends into the substrate from the first surface of the substrate,
the deep isolation pattern is disposed in a second trench that penetrates the shallow isolation pattern and that extends toward the second surface of the substrate, and
the dielectric pattern covers a portion of a bottom surface of the first trench.

19. The image sensor of claim 18, further comprising:
a plurality of transistors disposed on the first surface of the substrate;
a plurality of wiring patterns disposed on the first surface of the substrate and connected to the transistors;
a micro-lens array disposed on the second surface of the substrate; and
a color filter array disposed between the micro-lens array and the second surface of the substrate.

* * * * *